(12) United States Patent
Kawasaki et al.

(10) Patent No.: US 7,027,847 B2
(45) Date of Patent: *Apr. 11, 2006

(54) COMMUNICATIONS SYSTEM AND METHOD, WIRELESS COMMUNICATIONS SYSTEM, WIRELESS MICROPHONE AND WIRELESS RECEIVER

(75) Inventors: Yuji Kawasaki, Kanagawa-ken (JP); Motoshi Suzuki, Kanagawa-ken (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 859 days.

This patent is subject to a terminal disclaimer.

(21) Appl. No.: 09/885,429

(22) Filed: Jun. 20, 2001

(65) Prior Publication Data

US 2002/0197957 A1    Dec. 26, 2002

(30) Foreign Application Priority Data

Jun. 20, 2000   (JP)   ............... 2000-185060

(51) Int. Cl.
*H04B 1/10*   (2006.01)
(52) U.S. Cl. ........................... 455/702; 455/212
(58) Field of Classification Search ............... 455/212, 455/208, 569.1, 218, 222, 223, 702
See application file for complete search history.

(56) References Cited

U.S. PATENT DOCUMENTS

| | | | | |
|---|---|---|---|---|
| 5,365,546 A | * | 11/1994 | Koenck et al. | 375/223 |
| 5,408,698 A | * | 4/1995 | Serizawa et al. | 455/245.1 |
| 5,636,140 A | * | 6/1997 | Lee et al. | 370/469 |
| 5,758,268 A | * | 5/1998 | Murakami et al. | 455/114.1 |
| 5,808,224 A | * | 9/1998 | Kato | 84/609 |
| 5,815,298 A | * | 9/1998 | Cern | 398/16 |
| 5,937,018 A | * | 8/1999 | Golden | 375/347 |
| 5,982,816 A | * | 11/1999 | Ogita et al. | 375/240 |
| 6,074,215 A | * | 6/2000 | Tsurumi | 434/307 A |
| 6,091,329 A | * | 7/2000 | Newman | 340/539.15 |
| 6,671,503 B1 | * | 12/2003 | Niwamoto | 455/212 |
| 2003/0061047 A1 | * | 3/2003 | Yoshioka et al. | |
| 2004/0007120 A1 | * | 1/2004 | Futamase et al. | |

FOREIGN PATENT DOCUMENTS

| | | |
|---|---|---|
| JP | 62-269497 | 11/1987 |
| JP | 05-091557 | 4/1993 |
| JP | 05-316573 | 11/1993 |
| JP | 6-113376 | 4/1994 |
| JP | 09-191259 | 7/1997 |
| TW | 0 675 666 | * 4/1995 |

* cited by examiner

Primary Examiner—William J. Deane, Jr.
(74) Attorney, Agent, or Firm—Pearne & Gordon LLP

(57) ABSTRACT

Herein disclosed a communications system according to the present invention comprises, a wireless microphone transmission apparatus for transmitting a radio microphone signal on a predetermined wireless microphone frequency channel carrying a voice signal and a tone signal; and a wireless receiving apparatus for receiving the radio microphone signal on the predetermined wireless microphone frequency channel carrying the voice signal and the tone signal transmitted by the wireless microphone transmission apparatus. The wireless receiving apparatus includes an integral computing unit for sequentially computing integrals of the signal levels of the tones of the tone signal at first predetermined time intervals and a data information computing unit for sequentially computing differences between two respective integrals of the signal levels of the tones of the tone signal, at respective second predetermined time intervals to acquire data information.

25 Claims, 23 Drawing Sheets

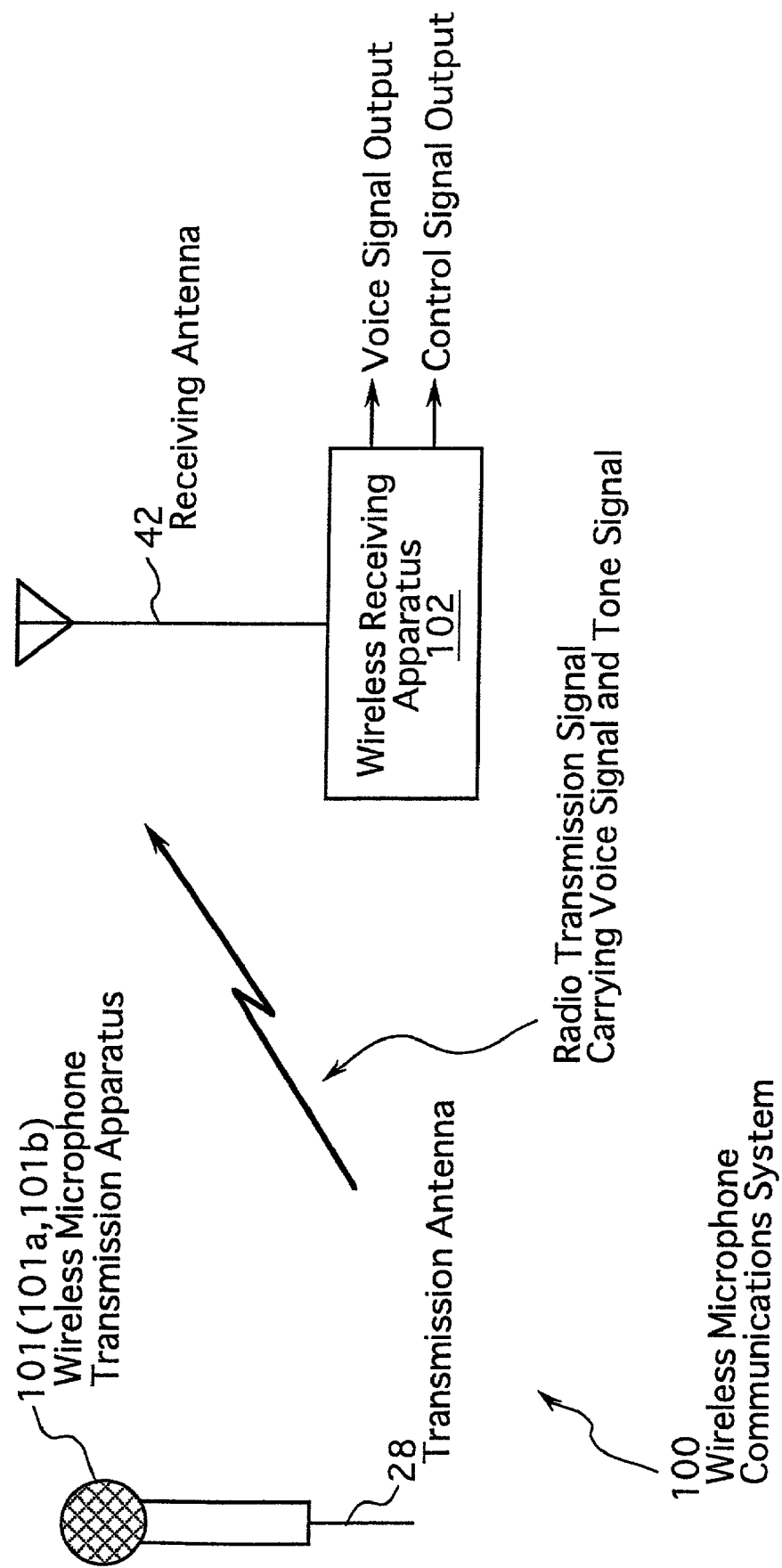

F I G. 4
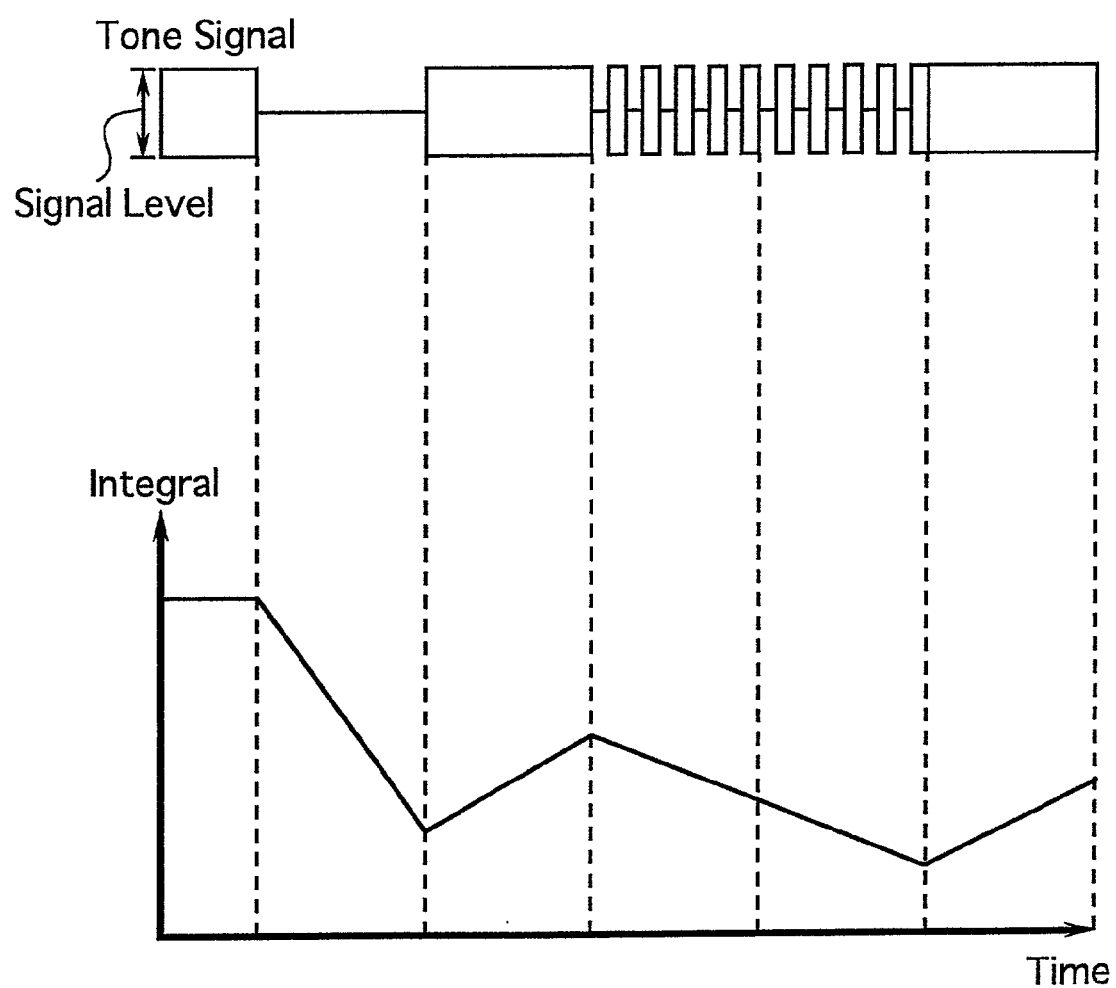

FIG. 10

Structure of 7-Bit Length Data

| Bit No. | 1 | 2 | 3 | 4 | 5 | 6 | 7 |
|---|---|---|---|---|---|---|---|
| Data Elements | – | Low | # | # | # | % | % |

1 : Start Bit Element
2 : Bit Length Identifier
3~5 : Control Data element
6, 7 : BCC Data element

F I G. 1 1

Structure of 13-Bit Length Data

| Bit No. | 1 | 2 | 3 | 4 | 5 | 6 | 7 | 8 | 9 | 10 | 11 | 12 | 13 |
|---|---|---|---|---|---|---|---|---|---|---|---|---|---|
| Data Elements | - | Hi | | # | # | # | # | # | # | % | % | % | % |

1 : Start Bit Element
2 : Bit Length Identifier
3 : Data Type
4~9 : Battery Voltage Data Element
10~13 : BCC Data Element F I G. 1 7
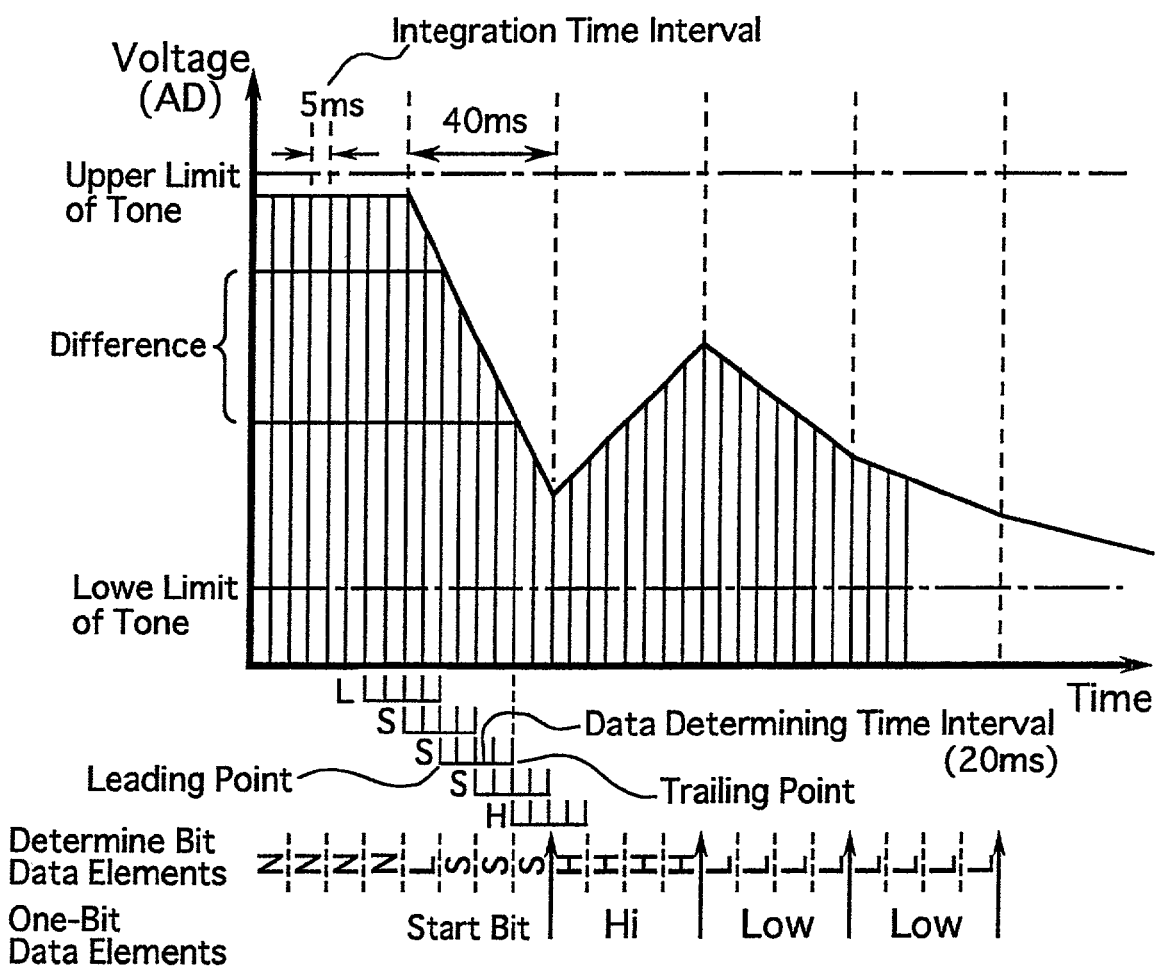

COMMUNICATIONS SYSTEM AND METHOD, WIRELESS COMMUNICATIONS SYSTEM, WIRELESS MICROPHONE AND WIRELESS RECEIVER

BACKGROUND OF THE INVENTION

1. Field of the Invention

The present invention relates to a communications system for transmitting and receiving a voice signal and a tone signal, and more particularly, to a communications system, a communication method, a wireless communications system, a wireless microphone, and a wireless receiver for transmitting and receiving a voice signal and a tone signal.

2. Description of the Related Art

There have been proposed a wide variety of wireless communications systems each comprising a wireless microphone transmission apparatus for inputting a voice therethrough, converting the voice into a voice signal, modulating the voice signal with a carrier signal to generate a radio microphone signal, and transmitting the radio microphone signal carrying the voice signal, and a wireless receiving apparatus for receiving the radio microphone signal carrying the voice signal transmitted by the wireless microphone transmission apparatus, demodulating the radio microphone signal to generate the voice signal, converting the voice signal into the voice, and outputting the voice therethrough, thereby omitting a cable connecting between the wireless microphone transmission apparatus and the wireless receiving apparatus.

In such a wireless communications system, the wireless receiving apparatus is provided with a squelch circuit which is operative to cut off the operation of outputting the voice if the signal level of the received voice signal falls too low or the signal level of the noise signal increases too high, thereby avoiding a situation where high noise signals are outputted in the absence of wanted voice signals. The operation of the squelch circuit for cutting off the operation of outputting the voice if the level of the received voice signal falls too low or the level of the noise signal is too high will be hereinlater referred to as a "squelch operation". The wireless communications system controls the squelch circuit to avoid outputting high noise signals when the wireless microphone transmission apparatus is turned off and not transmitting any voice signal.

The radio microphone signal transmitted by the wireless microphone transmission apparatus may include a noise signal, a carrier signal, and a tone signal. The squelch circuit includes various types such as a noise squelch circuit for performing the squelch operation on the basis of the noise signal contained in the received radio microphone signal, a carrier squelch circuit for performing the squelch operation on the basis of the carrier component contained in the received radio microphone signal, and a tone squelch circuit for performing the squelch operation on the basis of the tone signal contained in the received radio microphone signal.

The noise squelch circuit and the carrier squelch circuit encounters drawbacks being inclined to operate malfunctions due to the fact that they are vulnerable to misidentifying noises unnecessarily emitted from electrical appliances such as a personal computer, a pachinko machine and an air cleaning device. The wireless receiving apparatus is therefore equipped with the tone squelch circuit in addition to the noise squelch circuit or the carrier squelch circuit to prevent from performing malfunctions caused by the noises emitted from the electrical appliances.

The wireless microphone transmission apparatus is designed neither to transmit any tone signal until a predetermined time elapses after the turn-on operation of the wireless microphone transmission apparatus, nor to turn off the power until a predetermined time elapses after the turn-off operation of the power switch, in order to cut off noises occurred when the wireless microphone transmission apparatus is turned on and off.

Referring to FIGS. 21, 22, and 23 of the drawings, there is shown a conventional wireless communications system 700 of this type comprising a conventional wireless microphone transmission apparatus 710 and a conventional wireless receiving apparatus 740. In this conventional wireless communications system 700, the conventional wireless microphone transmission apparatus 710 is adapted to transmit a tone signal when the wireless microphone transmission apparatus 710 is turned on. The conventional wireless receiving apparatus 740 is equipped with a squelch circuit section 727 operative not to output a voice signal when no tone signal is received from the conventional wireless microphone transmission apparatus 710.

The conventional wireless microphone transmission apparatus 710 is shown in FIG. 21 as comprising a voice inputting section 701 for inputting a voice information therethrough and converting the voice information into a voice signal, a tone signal generating section 702 for generating a tone signal, a mixing section 703 for mixing the voice signal and the tone signal to generate a transmission signal, an oscillation section 704 for generating a carrier signal, a modulating section 705 for modulating the transmission signal with the carrier signal, a high-frequency amplifying section 706 for amplifying the modulated transmission signal to generate a radio microphone signal on a particular microphone frequency channel, and a transmission antenna 707 for transmitting the radio microphone signal on the particular microphone frequency channel to the conventional wireless receiving apparatus 740.

The conventional wireless receiving apparatus 740 is shown in FIG. 22 as comprising a receiving antenna 721 for receiving radio microphone signals, a high-frequency amplifying section 722 for amplifying the received radio microphone signals, a frequency conversion section 723 for selecting a radio microphone signal on the particular microphone frequency channel from among the radio microphone signals and converting the selected radio microphone signal on the particular microphone frequency channel into a intermediate-frequency microphone signal, an intermediate-frequency amplifying section 724 for amplifying the intermediate-frequency microphone signal, a decoding section 725 for generating a microphone signal from the intermediate-frequency microphone signal thus amplified, a band pass filter (referred to as "BPF") 726 for filtering the voice signal therethrough from the microphone signal inputted by the decoding section 725, a squelch circuit section 727 for cutting off or passing through the voice signal inputted from band pass filter 726, a low-frequency amplifying section 728 for amplifying the voice signal, a crystal filter 729 for filtering the tone signal therethrough from the microphone signal inputted by the decoding section 725, and a squelch circuit control section 730 for controlling the squelch circuit section 727 to have the voice signal cut off or pass through on the basis of the tone signal inputted from the crystal filter 729. The conventional wireless receiving apparatus 740 thus constructed can extract the voice signal and tone signal from the received radio microphone signal to output the voice signal and tone signal separately.

In the conventional wireless receiving apparatus 740 thus constructed, the squelch circuit control section 730 is operative to control the squelch circuit section 727 so as to output the voice signal only when the tone signal is filtered through by the crystal filter 729. Otherwise, the squelch circuit control section 730 is operative to cut off the electrical connection between the BPF 726 and the low-frequency amplifying section 728 to prevent any noise signal from being outputted.

FIG. 23 is a graph showing an example of a transmission signal, i.e., a radio microphone signal including a voice signal and a tone signal transmitted and received in the conventional wireless communications system 700. As will be understood from FIG. 23, the frequency of the tone signal is generally chosen outside of the frequency range of the voice signal.

The wireless communications system is recently utilized in an occasion of making a presentation. During the presentation, a presenter is required to control operations of various devices such as, for example, the sound level of the wireless receiving apparatus which receives and amplifies the presenter's voice, the operation of the recording apparatus which records the presenter's presentation, and replaying and adjusting operations of the video tape recorder. Thus, the presenter tends to utilize the wireless communications system not only for amplifying the presenter's voice but also for controlling the operations of the other devices. Some types of the wireless communications system use the tone signal for conveying control data in order to control the operations of various devices.

Such types of wireless communications system include two types consisting of a first type of wireless communications system for amplitude-modulating a tone signal to convey a control data, and a second type wireless communications system for generating a tone signal having a plurality of tones each having a signal level and repeated at predetermined time intervals to convey a control data. The wireless communications system of the second type is disclosed, for example, in Japanese Patent Laid-open Publication No. 6-113376 as comprising a wireless microphone transmission apparatus including a tone generating section for generating a tone signal having a plurality of tones repeated at predetermined time intervals and a wireless receiving apparatus. "A tone signal" is intended to mean "a plurality of tones having a signal level" oscillated or repeated at "time intervals". The wireless microphone transmission apparatus disclosed therein is adapted to transmit a radio microphone signal carrying a tone signal indicative of a control data having a plurality of tones repeated at predetermined time intervals, and the wireless receiving apparatus disclosed therein is adapted to receive the radio microphone signal to extract the tone signal and detect the control data, thereby making it possible for the wireless communications system to have a tone signal transmitted and received.

The above wireless communications system, however encounters a drawback that the squelch circuit may cut off the wanted voice when no tone signal happens to be detected for a certain time interval as a result of an incidental combination of tone signals.

The above wireless communications system encounters another drawback that the wireless receiving apparatus of the above system is required to include one extraction circuit for extracting one type of tone signal having tones repeated at predetermined time intervals. This means that the wireless receiving apparatus of the above system is required to include two extraction circuits for extracting two types of tone signals each having tones repeated at respective predetermined time interval. This leads to the fact that the wireless receiving apparatus of the above system is required to include the same number of extraction circuits as the number of types of tone signals each having tones repeated at respective predetermined time interval.

Furthermore, the above wireless communications system encounters another drawback that the sensitivity is deteriorated and the transmission distance is shortened because the signal to noise ratio, i.e., SN ratio is worsened whenever the tone signals are amplitude-modulated.

SUMMARY OF THE INVENTION

It is therefore a primary object of the present invention to provide a communications system which realizes a high reliability, a high sensitivity, and a long transmission distance.

It is another object of the present invention to provide a communication method which realizes a high reliability, a high sensitivity, and a long transmission distance.

It is a further object of the present invention to provide a wireless communications system which realizes a high reliability, a high sensitivity, and a long transmission distance.

It is a still further object of the present invention to provide a wireless microphone transmission apparatus which realizes a high reliability, a high sensitivity, and a long transmission distance.

It is a yet still further object of the present invention to provide a wireless receiving apparatus which realizes a high reliability, a high sensitivity, and a long transmission distance.

In accordance with a first aspect of the present invention, there is provided a communications system for transmitting and receiving a carrier communication signal carrying a voice signal indicative of voice information and a tone signal indicative of data information, comprising: transmission means for transmitting the carrier communication signal carrying the voice signal and the tone signal; and receiving means for receiving the carrier communication signal carrying the voice signal and the tone signal transmitted by the transmission means, the transmission means including: a voice inputting unit for inputting the voice information therethrough to generate the voice signal indicative of the voice information; a data inputting unit for inputting the data information therethrough; a tone signal generating unit for generating the tone signal indicative of the data information on the basis of the data information inputted by the data inputting unit, the tone signal having a plurality of tones each having a signal level and repeated at predetermined time intervals; a mixing unit for mixing the voice signal generated by the voice inputting unit and the tone signal generated by the tone signal generating unit to generate a communication signal carrying the voice signal and the tone signal; a modulating unit for modulating the communication signal carrying the voice signal and the tone signal generated by the mixing unit with a carrier signal to generate a carrier communication signal carrying the voice signal and the tone signal; a transmission unit for transmitting the carrier communication signal carrying the voice signal indicative of the voice information and the tone signal indicative of the data information modulated by the modulating unit, therethrough, and the receiving means including: a receiving unit for receiving the carrier communication signal carrying the voice signal indicative of the voice information and the tone signal indicative of the data information transmitted by the transmission means; a demodulating unit for demodulating the carrier communication signal carrying the voice information and the tone signal received by the receiving unit to generate the communication signal; a voice signal filtering unit for filtering the voice signal indicative of the voice information therethrough from the communication signal generated by the demodulating unit; a tone signal filtering unit for filtering the tone signal therethrough from the communication signal generated by the demodulating unit; an integral computing unit for sequentially computing integrals of the signal levels of the tones of the tone signal passed through by the tone signal filtering unit, at first predetermined time intervals; a data information computing unit for sequentially computing differences between two respective integrals of the signal levels of the tones of the tone signal computed by the integral computing unit, at respective second predetermined time intervals each starting at a leading point and ending at a trailing point to acquire the data information on the basis of the differences; a data information outputting unit for outputting the data information acquired by the data information computing unit, therethrough; and a voice information outputting unit for outputting the voice information on the basis of the voice signal filtered through by the voice signal filtering unit, therethrough, in accordance with the data information outputted by the data information outputting unit.

In the aforesaid communications system, the data information computing unit of the receiving means may be operative to judge whether the integrals of the signal levels of the tones of the tone signal computed by the integral computing unit are in a predetermined detectable range, and if the data information computing unit judges that the integrals of the signal levels of the tones of the tone signal are not in the predetermined detectable range, the data information computing unit is operative to instruct the integral computing unit of the receiving means to compensate the integrals thus computed so that the integrals thus compensated are in the predetermined detectable range, and the data information computing unit is operative to sequentially compute differences between two respective integrals of the signal levels of the tones of the tone signal compensated by the integral computing unit, at respective second predetermined time intervals each starting at a leading point and ending at a trailing point to acquire the data information on the basis of the differences.

In accordance with a second aspect of the present invention, there is provided a communication method for transmitting and receiving a carrier communication signal carrying a voice signal indicative of voice information and a tone signal indicative of data information, comprising the steps of: (a) transmitting the carrier communication signal carrying the voice signal and the tone signal; and (b) receiving the carrier communication signal carrying the voice signal and the tone signal transmitted in the step (a), the step (a) including the steps of: (a1) inputting the voice information therethrough to generate the voice signal indicative of the voice information; (a2) inputting the data information therethrough; (a3) generating the tone signal indicative of the data information on the basis of the data information inputted in the step (a2), the tone signal having a plurality of tones each having a signal level and repeated at predetermined time intervals; (a4) mixing the voice signal generated in the step (a1) and the tone signal generated by the step (a3) to generate a communication signal carrying the voice signal and the tone signal; (a5) modulating the communication signal carrying the voice signal and the tone signal generated in the step (a4) with a carrier signal to generate a carrier communication signal carrying the voice signal and the tone signal; (a6) transmitting the carrier communication signal carrying the voice signal indicative of the voice information and the tone signal indicative of the data information modulated in the step (a5), therethrough, and the step (b) including the steps of: (b1) receiving the carrier communication signal carrying the voice signal indicative of the voice information and the tone signal indicative of the data information transmitted in the step (a); (b2) demodulating the carrier communication signal carrying the voice information and the tone signal received in the step (b1) to generate the communication signal; (b3) filtering the voice signal indicative of the voice information therethrough from the communication signal generated in the step (b2); (b4) filtering the tone signal therethrough from the communication signal generated in the step (b2); (b5) sequentially computing integrals of the signal levels of the tones of the tone signal passed through in the step (b4), at first predetermined time intervals; (b6) sequentially computing differences between two respective integrals of the signal levels of the tones of the tone signal computed in the step (b5), at respective second predetermined time intervals each starting at a leading point and ending at a trailing point to acquire the data information on the basis of the differences; (b7) outputting the data information acquired by the step (b6), therethrough; and (b8) outputting the voice information on the basis of the voice signal filtered through in the step (b3), therethrough, in accordance with the data information outputted in the step (b7).

In the aforesaid communication method, the step (b6) may have the step of (b61) judging whether the integrals of the signal levels of the tones of the tone signal computed by the (b5) are in a predetermined detectable range, and if it is judged that the integrals of the signal levels of the tones of the tone signal are not in the predetermined detectable range in the step (b61), the step (b5) has the step of (b51) compensating the integrals thus computed so that the integrals thus compensated are in the predetermined detectable range, and the step (b6) has the step of (b62) sequentially compute differences between two respective integrals of the signal levels of the tones of the tone signal compensated by the (b51), at respective second predetermined time intervals each starting at a leading point and ending at a trailing point to acquire the data information on the basis of the differences.

In accordance with a third aspect of the present invention, there is provided a wireless communications system for transmitting and receiving a radio microphone signal carrying a voice signal indicative of voice information and a tone signal indicative of data information, comprising: at least one wireless microphone transmission apparatus for transmitting the radio microphone signal on a predetermined wireless microphone frequency channel carrying the voice signal and the tone signal; and one wireless receiving apparatus for receiving the radio microphone signal on the predetermined wireless microphone frequency channel carrying the voice signal and the tone signal transmitted by the wireless microphone transmission apparatus, the wireless microphone frequency channel allocated to each of the wireless microphone transmission apparatuses and the wireless receiving apparatus; the wireless microphone transmission apparatus including: a voice inputting unit for inputting the voice information therethrough to generate the voice signal indicative of the voice information; a data inputting unit for inputting the data information therethrough; a tone signal generating unit for generating the tone signal indicative of the data information on the basis of the data information inputted by the data inputting unit, the tone signal having a plurality of tones each having a signal level and repeated at predetermined time intervals; a mixing unit for mixing the voice signal generated by the voice inputting unit and the tone signal generated by the tone signal generating unit to generate a microphone signal carrying the voice signal and the tone signal; a modulating unit for modulating the microphone signal on the predetermined wireless microphone frequency channel carrying the voice signal and the tone signal generated by the mixing unit with a carrier signal to generate the radio microphone signal on the predetermined wireless microphone frequency channel carrying the voice signal and the tone signal; a transmission unit for transmitting the radio microphone signal on the predetermined wireless microphone frequency channel carrying the voice signal indicative of the voice information and the tone signal indicative of the data information modulated by the modulating unit, therethrough, and the wireless receiving apparatus including: a receiving unit for receiving the radio microphone signal on the predetermined wireless microphone frequency channel carrying the voice signal indicative of the voice information and the tone signal indicative of the data information transmitted by the wireless microphone transmission apparatus; a demodulating unit for demodulating the radio microphone signal on the predetermined wireless microphone frequency channel carrying the voice information and the tone signal received by the receiving unit to generate the microphone signal; a voice signal filtering unit for filtering the voice signal indicative of the voice information therethrough from the microphone signal generated by the demodulating unit; a tone signal filtering unit for filtering the tone signal therethrough from the microphone signal generated by the demodulating unit; an integral computing unit for sequentially computing integrals of the signal levels of the tones of the tone signal passed through by the tone signal filtering unit, at first predetermined time intervals; a data information computing unit for sequentially computing differences between two respective integrals of the signal levels of the tones of the tone signal computed by the integral computing unit, at respective second predetermined time intervals each starting at a leading point and ending at a trailing point to acquire the data information on the basis of the differences; a data information outputting unit for outputting the data information acquired by the data information computing unit, therethrough; and a voice information outputting unit for outputting the voice information on the basis of the voice signal filtered through by the voice signal filtering unit, therethrough, in accordance with the data information outputted by the data information outputting unit.

In accordance with a fourth aspect of the present invention, there is provided a wireless communications system for transmitting and receiving a radio microphone signal carrying a voice signal indicative of voice information and a tone signal indicative of data information, comprising: at least one wireless microphone transmission apparatus for transmitting the radio microphone signal on a predetermined wireless microphone frequency channel carrying the voice signal and the tone signal; and a plurality of wireless receiving apparatuses for receiving the radio microphone signal on the predetermined wireless microphone frequency channel carrying the voice signal and the tone signal transmitted by the wireless microphone transmission apparatus, the wireless microphone frequency channel allocated to each of the wireless microphone transmission apparatuses and the wireless receiving apparatuses, the wireless microphone transmission apparatus operative to transmit the radio microphone signal on the predetermined wireless microphone frequency channel to one or more specified wireless receiving apparatuses including: a voice inputting unit for inputting the voice information therethrough to generate the voice signal indicative of the voice information; a data inputting unit for inputting the data information therethrough; a tone signal generating unit for generating the tone signal indicative of the data information on the basis of the data information inputted by the data inputting unit, the tone signal having a plurality of tones each having a signal level and repeated at predetermined time intervals; a mixing unit for mixing the voice signal generated by the voice inputting unit and the tone signal generated by the tone signal generating unit to generate a microphone signal carrying the voice signal and the tone signal; a modulating unit for modulating the microphone signal carrying the voice signal and the tone signal generated by the mixing unit with a carrier signal to generate the radio microphone signal on the predetermined wireless microphone frequency channel carrying the voice signal and the tone signal; a transmission unit for transmitting the radio microphone signal on the predetermined wireless microphone frequency channel carrying the voice signal indicative of the voice information and the tone signal indicative of the data information modulated by the modulating unit, therethrough, and the wireless receiving apparatus including: a receiving unit for receiving the radio microphone signal on the predetermined wireless microphone frequency channel carrying the voice signal indicative of the voice information and the tone signal indicative of the data information transmitted by the wireless microphone transmission apparatus; a demodulating unit for demodulating the radio microphone signal on the predetermined wireless microphone frequency channel carrying the voice information and the tone signal received by the receiving unit to generate the microphone signal; a voice signal filtering unit for filtering the voice signal indicative of the voice information therethrough from the microphone signal generated by the demodulating unit; a tone signal filtering unit for filtering the tone signal therethrough from the microphone signal generated by the demodulating unit; an integral computing unit for sequentially computing integrals of the signal levels of the tones of the tone signal passed through by the tone signal filtering unit, at first predetermined time intervals; a data information computing unit for sequentially computing differences between two respective integrals of the signal levels of the tones of the tone signal computed by the integral computing unit, at respective second predetermined time intervals each starting at a leading point and ending at a trailing point to acquire the data information on the basis of the differences; a data information outputting unit for outputting the data information acquired by the data information computing unit, therethrough; and a voice information outputting unit for outputting the voice information on the basis of the voice signal filtered through by the voice signal filtering unit, therethrough, in accordance with the data information outputted by the data information outputting unit.

In the aforesaid wireless communications system, the data information computing unit of the wireless receiving apparatus may be operative to judge whether the integrals of the signal levels of the tones of the tone signal computed by the integral computing unit are in a predetermined detectable range, and if the data information computing unit judges that the integrals of the signal levels of the tones of the tone signal are not in the predetermined detectable range, the data information computing unit is operative to instruct the integral computing unit of the wireless receiving apparatus to compensate the integrals thus computed so that the integrals thus compensated are in the predetermined detectable range, and the data information computing unit is operative to sequentially compute differences between two respective integrals of the signal levels of the tones of the tone signal compensated by the integral computing unit, at respective second predetermined time intervals each starting at a leading point and ending at a trailing point to acquire the data information on the basis of the differences.

In the aforesaid wireless communications system, the data information may include sound level control data information, the data inputting unit of the wireless microphone transmission apparatus is equipped with a sound level control unit for inputting the sound level control data information therethrough, the data tone signal generating unit of the wireless microphone transmission apparatus is operative to generate a tone signal indicative of the data information including the sound level control data information, the wireless receiving apparatus is operative to receive the radio microphone signal on the predetermined wireless microphone frequency channel carrying the voice signal indicative of the voice information and the tone signal indicative of the data information including the sound level control data information transmitted by the wireless microphone transmission apparatus, and the data information outputting unit of the wireless receiving apparatus is operative to output the data information including the sound level control data information.

In the aforesaid wireless communications system, the data information may include a plurality of control data information elements, the data inputting unit of the wireless microphone transmission apparatus is equipped with a plurality of operation switches each for inputting the control data information element therethrough in accordance with an operation mode, and a mode selection switch for inputting mode information therethrough to select the operation mode from among a plurality of operation modes on the basis of the mode information, the data tone signal generating unit of the wireless microphone transmission apparatus is operative to generate a tone signal indicative of the data information including the control data information elements inputted by the operation switch, the wireless receiving apparatus is operative to receive the radio microphone signal on the predetermined wireless microphone frequency channel carrying the voice signal indicative of the voice information and the tone signal indicative of the data information including the control data information element transmitted by the wireless microphone transmission apparatus, and the data information outputting unit of the wireless receiving apparatus is operative to output the data information including the control data information element.

In the aforesaid wireless communications system, the wireless receiving apparatus may be operative to receive the radio microphone signal on the predetermined wireless microphone frequency channel carrying the voice signal indicative of the voice information and the tone signal indicative of the data information including the sound level control data information sequentially transmitted by one or more wireless microphone transmission apparatuses, and the data information outputting unit of the wireless receiving apparatus is operative to sequentially output the data information including the sound level control data information.

The aforesaid wireless communications system may comprise an audio system electrically connected with the wireless receiving apparatus, in which the data information includes audio system control data, the data information outputting unit of the wireless receiving apparatus is operative to output the audio system control data to the audio system, the voice information outputting unit of the wireless receiving apparatus is operative to output the voice information to the audio system, and the audio system is operative to operate in accordance with the audio system control data.

The aforesaid wireless communications system may further comprise an audio-visual system electrically connected with the wireless receiving apparatus, in which the data information includes audio-visual system control data, the data information outputting unit of the wireless receiving apparatus is operative to output the audio-visual system control data to the audio-visual system, the voice information outputting unit of the wireless receiving apparatus is operative to output the voice information to the audio-visual system, and the audio-visual system is operative to operate in accordance with the audio-visual system control data.

In the aforesaid wireless communications system, the data information outputting unit of the wireless receiving apparatus may be capable of being electrically connected with an external device and outputting the data information to the external device.

In the aforesaid wireless communications system, the voice information outputting unit of the wireless receiving apparatus may be capable of being electrically connected with an external device and outputting the voice information to the external device.

In accordance with a fifth aspect of the present invention, there is provided a wireless microphone transmission apparatus for transmitting a radio microphone signal on a predetermined wireless microphone frequency channel carrying a voice signal indicative of voice information and a tone signal indicative of data information, comprising: a voice inputting unit for inputting the voice information therethrough to generate the voice signal indicative of the voice information; a data inputting unit for inputting the data information therethrough; a tone signal generating unit for generating the tone signal indicative of the data information on the basis of the data information inputted by the data inputting unit, the tone signal having a plurality of tones each having a signal level and repeated at predetermined time intervals; a mixing unit for mixing the voice signal generated by the voice inputting unit and the tone signal generated by the tone signal generating unit to generate a microphone signal carrying the voice signal and the tone signal; a modulating unit for modulating the microphone signal carrying the voice signal and the tone signal generated by the mixing unit with a carrier signal to generate the radio microphone signal on the predetermined wireless microphone frequency channel carrying the voice signal and the tone signal; and a transmission unit for transmitting the radio microphone signal on the predetermined wireless microphone frequency channel carrying the voice signal indicative of the voice information and the tone signal indicative of the data information modulated by the modulating unit, therethrough.

In the aforesaid wireless microphone transmission apparatus, the wireless microphone transmission apparatus may be operative to transmit the radio microphone signal on the predetermined wireless microphone frequency channel to one or more specified wireless receiving apparatuses.

In the aforesaid wireless microphone transmission apparatus, the data information may include sound level control data information, the data inputting unit is equipped with a sound level control unit for inputting the sound level control data information therethrough, the data tone signal generating unit is operative to generate a tone signal indicative of the data information including the sound level control data information.

In the aforesaid wireless microphone transmission apparatus, the data information may include a plurality of control data information elements, the data inputting unit is equipped with a plurality of operation switches each for inputting the control data information element therethrough in accordance with an operation mode, and a mode selection switch for inputting mode information therethrough to select the operation mode from among a plurality of operation modes on the basis of the mode information, the data tone signal generating unit is operative to generate a tone signal indicative of the data information including the control data information elements inputted by the operation switch.

In accordance with a sixth aspect of the present invention, there is provided a wireless receiving apparatus for receiving a radio microphone signal on a predetermined wireless microphone frequency channel carrying a voice signal indicative of voice information and a tone signal indicative of data information, comprising: a receiving unit for receiving the radio microphone signal on the predetermined wireless microphone frequency channel carrying the voice signal indicative of the voice information and the tone signal indicative of the data information; a demodulating unit for demodulating the radio microphone signal on the predetermined wireless microphone frequency channel carrying the voice information and the tone signal received by the receiving unit to generate the microphone signal; a voice signal filtering unit for filtering the voice signal indicative of the voice information therethrough from the microphone signal generated by the demodulating unit; a tone signal filtering unit for filtering the tone signal therethrough from the microphone signal generated by the demodulating unit; an integral computing unit for sequentially computing integrals of the signal levels of the tones of the tone signal passed through by the tone signal filtering unit, at first predetermined time intervals; a data information computing unit for sequentially computing differences between two respective integrals of the signal levels of the tones of the tone signal computed by the integral computing unit, at respective second predetermined time intervals each starting at a leading point and ending at a trailing point to acquire the data information on the basis of the differences; a data information outputting unit for outputting the data information acquired by the data information computing unit, therethrough; and a voice information outputting unit for outputting the voice information on the basis of the voice signal filtered through by the voice signal filtering unit, therethrough, in accordance with the data information outputted by the data information outputting unit.

In the aforesaid wireless receiving apparatus, the data information computing unit may be operative to judge whether the integrals of the signal levels of the tones of the tone signal computed by the integral computing unit are in a predetermined detectable range, and if the data information computing unit judges that the integrals of the signal levels of the tones of the tone signal are not in the predetermined detectable range, the data information computing unit is operative to instruct the integral computing unit to compensate the integrals thus computed so that the integrals thus compensated are in the predetermined detectable range, and the data information computing unit is operative to sequentially compute differences between two respective integrals of the signal levels of the tones of the tone signal compensated by the integral computing unit, at respective second predetermined time intervals each starting at a leading point and ending at a trailing point to acquire the data information on the basis of the differences.

In the aforesaid wireless receiving apparatus, the receiving unit may be operative to receive the radio microphone signal on the predetermined wireless microphone frequency channel carrying the voice signal indicative of the voice information and the tone signal indicative of the data information sequentially transmitted by one or more wireless microphone transmission apparatuses, and the data information outputting unit is operative to sequentially output the data information.

The aforesaid wireless receiving apparatus may further comprise a terminal to be electrically connectable with an audio system, the data information including audio system control data, the data information outputting unit operative to output the audio system control data to the audio system, and the voice information outputting unit operative to output the voice information to the audio system.

The aforesaid wireless receiving apparatus may further comprise a terminal to be electrically connectable with an audio-visual system, the data information including audio-visual system control data, the data information outputting unit operative to output the audio-visual system control data to the audio-visual system, and the voice information outputting unit operative to output the voice information to the audio-visual system.

In the aforesaid wireless receiving apparatus, the data information outputting unit may be capable of being electrically connected with an external device and outputting the data information to the external device.

In the aforesaid wireless receiving apparatus, the voice information outputting unit may be capable of being electrically connected with an external device and outputting the voice information to the external device.

BRIEF DESCRIPTION OF THE DRAWINGS

The present invention and many of the attendant advantages thereof will be better understood from the following detailed description when considered in connection with the accompanying drawings, wherein:

FIG. 1 is a schematic block diagram of a wireless communications system according to the present invention;

FIG. 4 is a schematic block diagram and a graph used for describing a principle of transmitting a tone signal;

FIG. 10 is a table showing a structure of a 7-bit data string used for a communications system according to the present invention;

FIG. 11 is a table showing a structure of a 13-bit data string used for a communications system according to the present invention;

FIG. 17 is a graph used for describing the operation of computing bit data elements forming data information performed by the wireless receiving apparatus 102 shown in FIG. 3;

DESCRIPTION OF THE PREFERRED EMBODIMENTS

Figure 2:
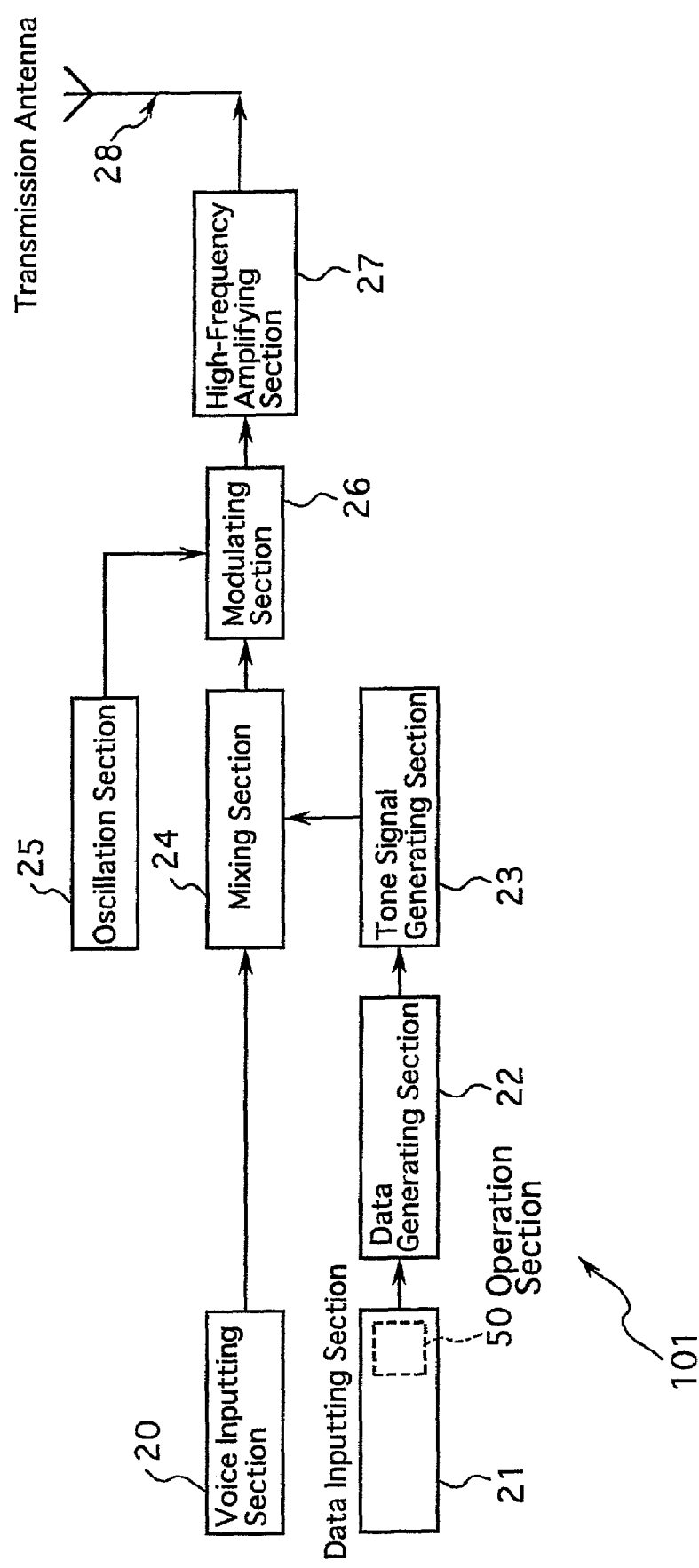
FIG. 2 is a schematic block diagram of a wireless microphone transmission apparatus 101 according to the present invention.

Referring now to FIGS. 1 to 20 of the drawing, there is best shown a preferred embodiment of a communications system, a communication method, a wireless communications system, a wireless microphone transmission apparatus, and a wireless receiving apparatus according to the present invention.

Throughout the following detailed description, similar reference characters refer to similar elements in all figures of the drawings.

As shown in FIG. 1, a wireless communications system 100 for transmitting and receiving a radio transmission signal, i.e., a radio microphone signal on a predetermined wireless microphone frequency channel carrying a voice signal indicative of voice information and a tone signal indicative of data information according to the present invention comprises a wireless microphone transmission apparatuses 101a and 101b each for transmitting the radio microphone signal on a respective predetermined wireless microphone frequency channel carrying the voice signal and the tone signal, and a wireless receiving apparatus 102 for receiving the radio microphone signal on the predetermined wireless microphone frequency channel carrying the voice signal and the tone signal transmitted by the wireless microphone transmission apparatus 101. A predetermined wireless microphone frequency channel is allocated to the wireless microphone transmission apparatus 101 and the wireless receiving apparatus 102.

The wireless microphone transmission apparatus 101 is shown in FIG. 2 as including a voice inputting section 20, a data inputting section 21, a data generating section 22, a tone signal generating section 23, a mixing section 24, an oscillation section 25, a modulating section 26, a high-frequency amplifying section 27, and a transmission antenna 28.

The voice inputting section 20 is adapted to input a voice therethrough to generate a voice signal indicative of the voice information. The voice inputting section 20 constitutes the voice inputting unit according to the present invention. The data inputting section 21 is adapted to input data information therethrough. The data inputting section 21 constitutes the data inputting unit according to the present invention. The data generating section 22 is adapted to input the data information inputted by the data inputting section 21 to generate a data string indicative of the data information to be outputted to the tone signal generating section 23. The tone signal generating section 23 is adapted to input the data string from the data generating section 22 to generate a tone signal indicative of the data information on the basis of the data string inputted by the data generating section 22. The tone signal has a plurality of tones repeated at predetermined time intervals. Each tone has a signal level. The data generating section 22 and the tone signal generating section 23 constitute the tone signal generating unit according to the present invention. The mixing section 24 is adapted to input the voice signal generated by the voice inputting section 20 and the tone signal generated by the tone signal generating section 23 to mix the voice signal and the tone signal to generate a microphone signal carrying the voice signal and the tone signal. The mixing section 24 constitutes the mixing unit according to the present invention. The oscillation section 25 is adapted to generate a carrier signal. The modulating section 26 is adapted to input the microphone signal from the mixing section 24 and the carrier signal from the oscillation section 25 to modulate the microphone signal carrying the voice signal and the tone signal with the carrier signal to generate a radio microphone signal on a predetermined wireless microphone frequency channel carrying the voice signal and the tone signal. The oscillation section 25 and the modulating section 26 constitute the modulating unit according to the present invention. The high-frequency amplifying section 27 is adapted to receive the radio microphone signal on the wireless microphone frequency channel from the modulating section 26 to amplify the radio microphone signal. The transmission antenna 28 is adapted to receive and transmit the radio microphone signal on the wireless microphone frequency channel carrying the voice signal and the tone signal thus amplified. The high-frequency amplifying section 27 and the transmission antenna 28 constitute the transmission unit according to the present invention. The wireless microphone transmission apparatuses 101, 101a and 101b constitute the transmission means and the wireless transmission apparatus according to the present invention.

Figure 3:
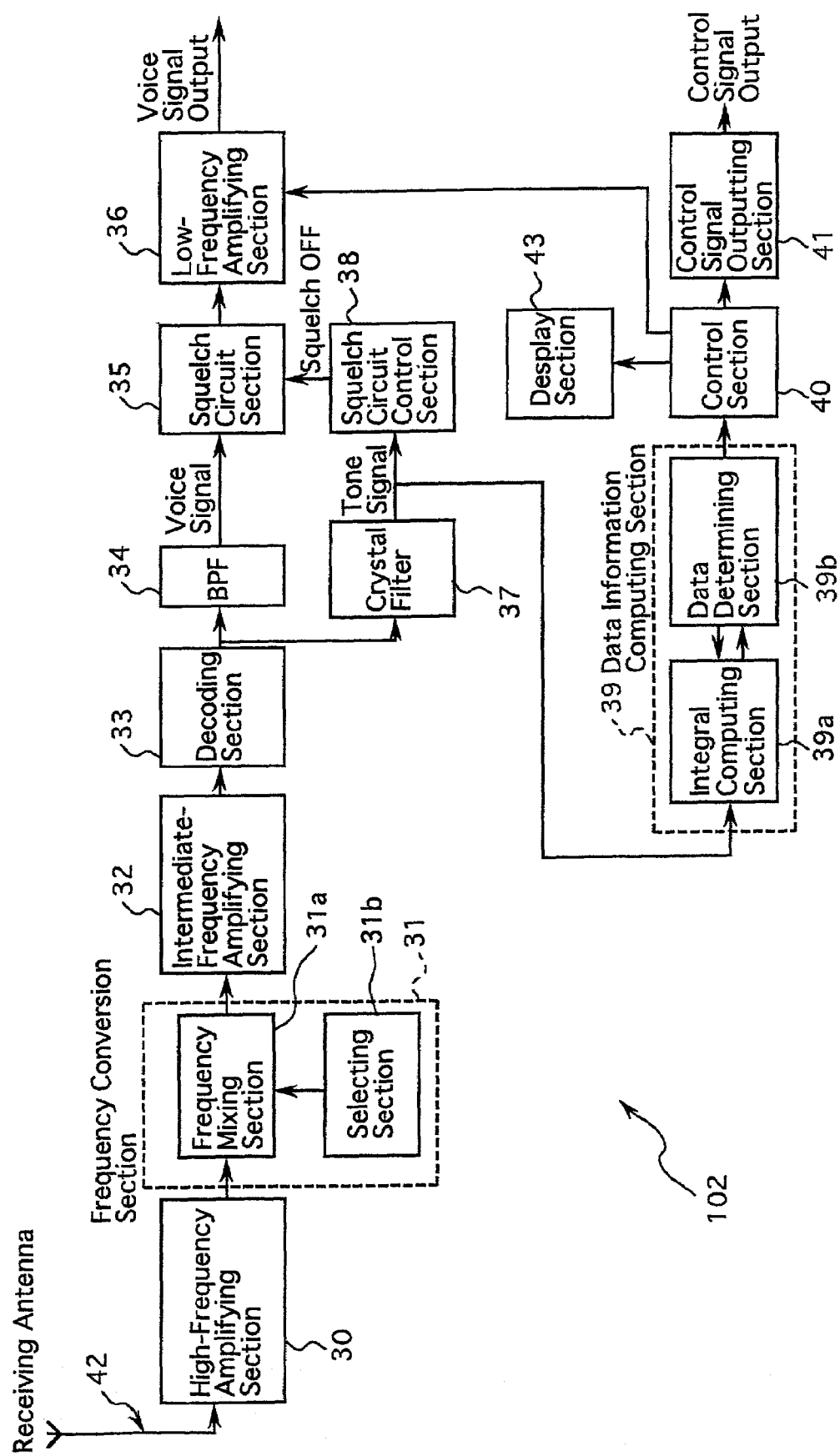
FIG. 3 is a schematic block diagram of a wireless receiving apparatus 102 according to the present invention.

The wireless receiving apparatus 102 is shown in FIG. 3 as comprising a receiving antenna 42, a high-frequency amplifying section 30, a frequency conversion section 31, an intermediate-frequency amplifying section 32, a decoding section 33, a BPF, i.e., a band pass filter 34, a squelch circuit section 35, a low-frequency amplifying section 36, a crystal filter 37, a squelch circuit control section 38, a data information computing section 39, a control section 40, a control signal outputting section 41, a display section 43. The receiving antenna 42 is adapted to receive the radio microphone signal on the predetermined wireless microphone frequency channel carrying the voice signal indicative of the voice information and the tone signal indicative of the data information transmitted by the wireless microphone transmission apparatus 101. The high-frequency amplifying section 30 is adapted to receive the radio microphone signal from the receiving antenna 42 and amplify the radio microphone signal thus received. The receiving antenna 42 and the high-frequency amplifying section 30 constitute the receiving unit according to the present invention. The frequency conversion section 31 includes a selecting section 31a and a frequency mixing section 31b. The selecting section 31a is adapted to select and generate a wireless microphone channel frequency and the frequency mixing section 31b is adapted to mix the radio microphone signal amplified by the high-frequency amplifying section 30 and the wireless microphone channel frequency generated by the frequency mixing section 31b to generate a intermediate-frequency microphone signal. The intermediate-frequency amplifying section 32 is adapted to amplify the intermediate-frequency microphone signal thus generated. The decoding section 33 is adapted to decode the intermediate-frequency microphone signal thus amplified to generate a microphone signal to be outputted to the band pass filter 34 and the crystal filter 37. The frequency conversion section 31, the intermediate-frequency amplifying section 32, and the decoding section 33 constitute the demodulating unit according to the present invention. The band pass filter 34 is adapted to filter a voice signal therethrough from the microphone signal generated by the decoding section 33 to output the filtered voice signal to the squelch circuit section 35. The band pass filter 34 constitutes the voice signal filtering unit according to the present invention. The squelch circuit section 35 is adapted to cut off or pass therethrough the voice signal filtered through by the band pass filter 34 to the low-frequency amplifying section 36. The low-frequency amplifying section 36 is adapted to amplify the voice signal passed through by the squelch circuit section 35 to output the amplified voice signal to constituent component(s), not shown. Furthermore, the low-frequency amplifying section 36 may be capable of being electrically connected with an external device, not shown by means of, for example, a terminal, and outputting the voice information to the external device. The squelch circuit section 35 and the low-frequency amplifying section 36 constitute the voice information outputting unit according to the present invention.

The crystal filter 37 is adapted to filter a tone signal therethrough from the microphone signal generated by the decoding section 33 to output the tone signal thus filtered to the squelch circuit control section 38 and the data information computing section 39. The crystal filter 37 constitutes the tone signal filtering unit according to the present invention. The squelch circuit control section 38 is adapted to control the squelch circuit section 35 to pass through or cut off the voice signal in accordance with the tone signal filtered through by the crystal filter 37. The wireless receiving apparatus 102 constitutes the receiving means and the wireless receiving apparatus according to the present invention.

The operation of the squelch circuit section 35 and the squelch circuit control section 38 will be hereinlater described in detail.

The squelch circuit control section 38 is operated to electrically connect the squelch circuit section 35 with the low-frequency amplifying section 36 to pass through the voice signal from the squelch circuit section 35 to the low-frequency amplifying section 36 if the tone signal is inputted to the squelch circuit control section 38 from the crystal filter 37. On the other hand, the squelch circuit control section 38 is operated to electrically disconnect the squelch circuit section 35 from the low-frequency amplifying section 36 to cut off the voice signal to be passed through from the squelch circuit section 35 to the low-frequency amplifying section 36 if no tone signal is inputted to the squelch circuit control section 38 from the crystal filter 37. The operation of electrically connecting the squelch circuit section 35 with the low-frequency amplifying section 36 to pass through the voice signal from the squelch circuit section 35 to the low-frequency amplifying section 36 will be hereinlater referred to as "squelch-off" and the operation of electrically disconnecting the squelch circuit section 35 from the low-frequency amplifying section 36 to cut off the voice signal to be passed through from the squelch circuit section 35 to the low-frequency amplifying section 36 will be hereinlater referred to as "squelch-on".

The data information computing section 39 is operated to compute data information in accordance with the tone signal filtered through by the crystal filter 37 and output the data information to the control section 40. The operation of the data information computing section 39 to compute the data information in accordance with the tone signal carried in the radio microphone signal transmitted by the wireless microphone transmission apparatus 101 will be described later.

The control section 40 is operated to input the data information outputted by the data information computing section 39 and output the data information to the control signal outputting section 41 and the display section 43. The display section is operated to display the data information. The control signal outputting section 41 is operated to receive the data information from the control section 40 to generate and output control signal(s) to be outputted to related constituent component(s), not shown. The constituent components may be control constituent components of the wireless receiving apparatus 102. This means that the control section 40 can control constituent components in accordance with the data information received from the data information computing section 39. Furthermore, the control signal outputting section 41 may be capable of being electrically connected by means of, for instance, a terminal with an external device including an audio-visual system and outputting the data information to the external device.

Alternatively, the control section 40 can control, for instance, the sound level of the voice signal outputted by the low-frequency amplifying section 36 in accordance with the data information. Similarly, the control section can control the sound level of the voice signal carried in the radio microphone signal transmitted by the other wireless microphone transmission apparatus, outputted by the low-frequency amplifying section 36 by changing switching the microphone frequency channel in accordance with the data information.

More particularly, the wireless receiving apparatus 102 according to the present invention can selectively receive any one of radio microphone signals on microphone frequency channels A and B, transmitted by the respective wireless microphone transmission apparatuses 101a and 101b. The microphone frequency channels A and B are allocated to the wireless microphone transmission apparatuses 101a and 101b, respectively. The control section 40 can, therefore, control the sound level of the voice signal carried in the radio microphone signal transmitted by any one of the wireless microphone transmission apparatuses

101*a* and 101*b*, outputted by the low-frequency amplifying section 36, by switching the microphone frequency channel to either one of the microphone frequency channels A and B, in accordance with the data information outputted by the data information computing section 39.

In the wireless microphone communications system 100 according to the present invention, the circuit to the control signal outputting section 41 is operated to be closed only when the data information is inputted, thereby enabling to save power. This means that no voltage is applied to the control signal outputting section 41 when no data information is inputted. The squelch circuit control section 38, the control section 40, signal outputting section 41 and the display section 43 constitute the data information outputting unit according to the present invention.

As described above, the wireless receiving apparatus 102 according to the present invention can selectively receive a radio microphone signal on a frequency channel from any one of two wireless microphone transmission apparatuses 101*a* and 101*b*. The wireless microphone transmission apparatuses 101*a* and 101*b* have predetermined microphone frequency channels A and B, respectively. This means that the wireless receiving apparatus 102 comprises two sets of the high-frequency amplifying section 30, the frequency conversion section 31, the intermediate-frequency amplifying section 32, the decoding section 33, the band pass filter 34, the squelch circuit section 35, the low-frequency amplifying section 36, the crystal filter 37, the squelch circuit control section 38, the data information computing section 39, the control section 40, and the control signal outputting section 41, each of which is dedicated to the microphone respective frequency channels A and B allocated to the respective wireless microphone transmission apparatuses 101*a* and 101*b*.

The tone signal indicative of the data information will be hereinlater described in detail.

The tone signal generating section 23 is operated to generate the tone signal when the wireless microphone transmission apparatus 101 is powered on. The tone signal thus generated is carried in the radio microphone signal and transmitted from the wireless microphone transmission apparatus 101 to the wireless receiving apparatus 102. In the wireless receiving apparatus 102, the crystal filter 37 is operated to filter the tone signal therethrough from the microphone signal decoded by the decoding section 33. The squelch circuit control section 38 is operated to receive the tone signal filtered through by the crystal filter 37, and control the squelch circuit section 35 to have the voice signal passed therethrough.

No tone signal is generated by the tone signal generating section 23 nor transmitted from the wireless microphone transmission apparatus 101 to the wireless receiving apparatus 102 when, on the other hand, the wireless microphone transmission apparatus 101 is powered off. In the wireless receiving apparatus 102, the squelch circuit control section 38 is operated to electrically disconnect the squelch circuit section 35 from the low-frequency amplifying section 36 to cut off the voice signal since no tone signal is inputted from the crystal filter 37.

The wireless receiving apparatus 102 is accordingly operated to output no voice signal when no radio microphone signal carrying tone signal is received, thereby enabling to prevent high level of noise signals from being outputted.

The wireless communications system 100 according to the present invention, furthermore, is operated to transmit and receive a tone signal indicative of data information carried in a radio microphone signal between the wireless microphone transmission apparatus 101 and the wireless receiving apparatus 102.

As shown in FIG. 4, a tone signal indicative of data information has a plurality of tones. The tones forming one tone signal have a signal level, and are repeated at predetermined time intervals. The time interval at which tones are repeated changes for every 40 milliseconds.

The time period of 40 milliseconds is a time period required to transmit one-bit data element. The squelch circuit control section 38 does not squelch-on the squelch circuit section 35 until 40 milliseconds elapse since no tone signal is received. In the wireless communications system 100 according to the present invention, the time period of 40 milliseconds therefore represents one-bit data element.

The time period representing one-bit data element being shorter than 40 milliseconds may lead the wireless receiving apparatus 102 to misidentify the tone signal, thereby causing the squelch circuit control section 38 to erroneously squelch-off the squelch circuit section 35 to output a noise signal.

The time period of 40 milliseconds is appropriate for the wireless receiving apparatus 102 to identify the absence or presence of the tone signal, thereby causing the squelch circuit control section 38 to accurately squelch-on and squelch-off the squelch circuit section 35, thereby enabling to prevent the wanted voice signal from being cut off and a noise signal from being outputted.

Figure 5:
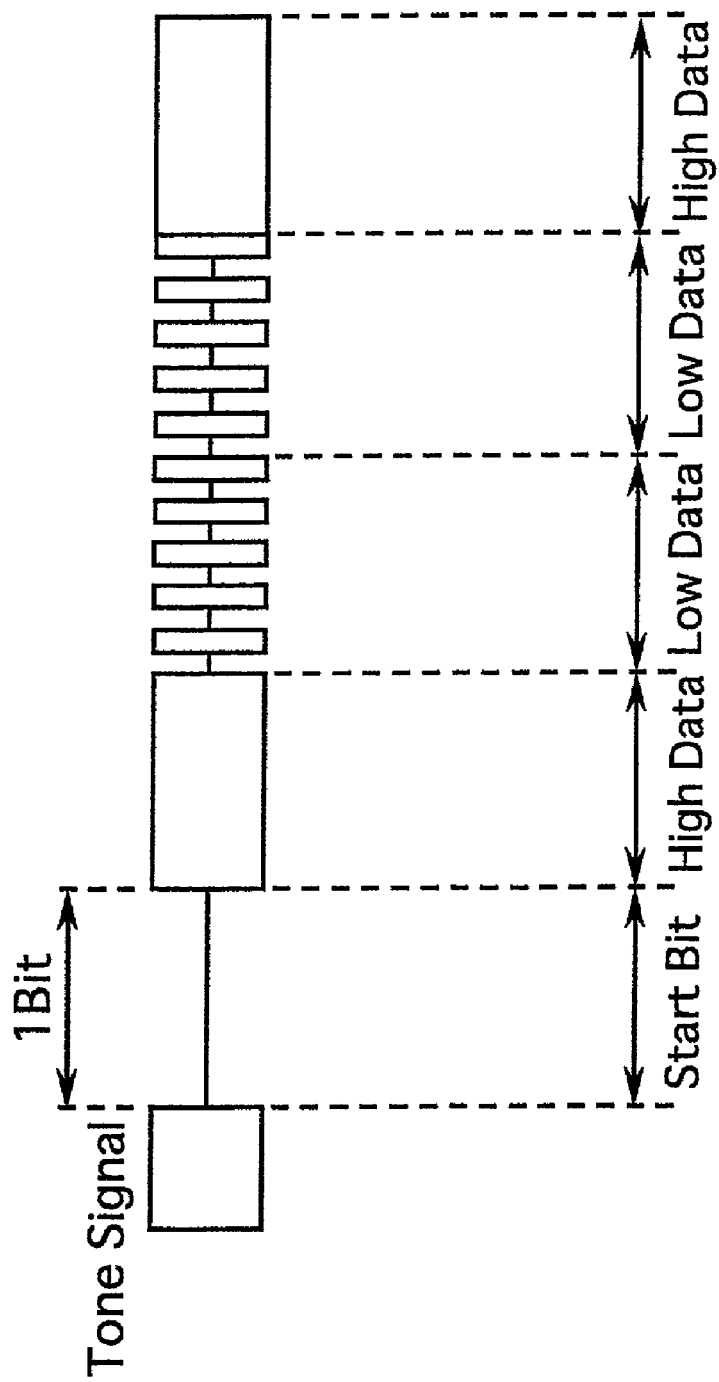
FIG. 5 is a schematic block diagram of an example of a bit pattern of a tone signal used by a communications system according to the present invention.

FIG. 5 shows an example of tones forming bit data elements of a tone signal carried in the microphone signal. A pattern of tones forming bit data elements is hereinlater referred to as a "bit pattern".

The bit pattern shown in FIG. 5 comprises one start bit, i.e., one start bit element, two pieces of low data, i.e., two low data elements and two pieces of high data, i.e., two high data elements. The start bit element is a bit data element having no tone for the time period of one bit-data element. The low data element is a bit data element having a plurality of tones repeated at a predetermined time interval. The high data element is a bit data element having one tone for the time period of one bit-data element.

In the wireless communications system 100 according to the present invention, the wireless microphone transmission apparatus 101 comprises a data generating section 22 for generating a tone signal indicative of data information including the aforesaid start bit element, low data elements and high data elements on the basis of the data information inputted by the data inputting section 21.

The operation of the data information computing section 39 to compute the data information in accordance with the tone signal carried in the radio microphone signal transmitted by the wireless microphone transmission apparatus 101 will be hereinlater described in detail.

The data information computing section 39 is operated to rectify a tone signal filtered through by crystal filter 37 and compute the integrals of the signal levels of the tones of the tone signal level thus rectified at predetermined integration time intervals. More particularly, the data information computing section 39 includes an integral computing section 39*a* and a data determining section 39*b*. The integral computing section 39*a* is operated to rectify the tone signal filtered through by the crystal filter 37 and sequentially compute the integrals of the signal levels of the tones of the tone signal thus rectified at predetermined integration time intervals.

Figure 6:
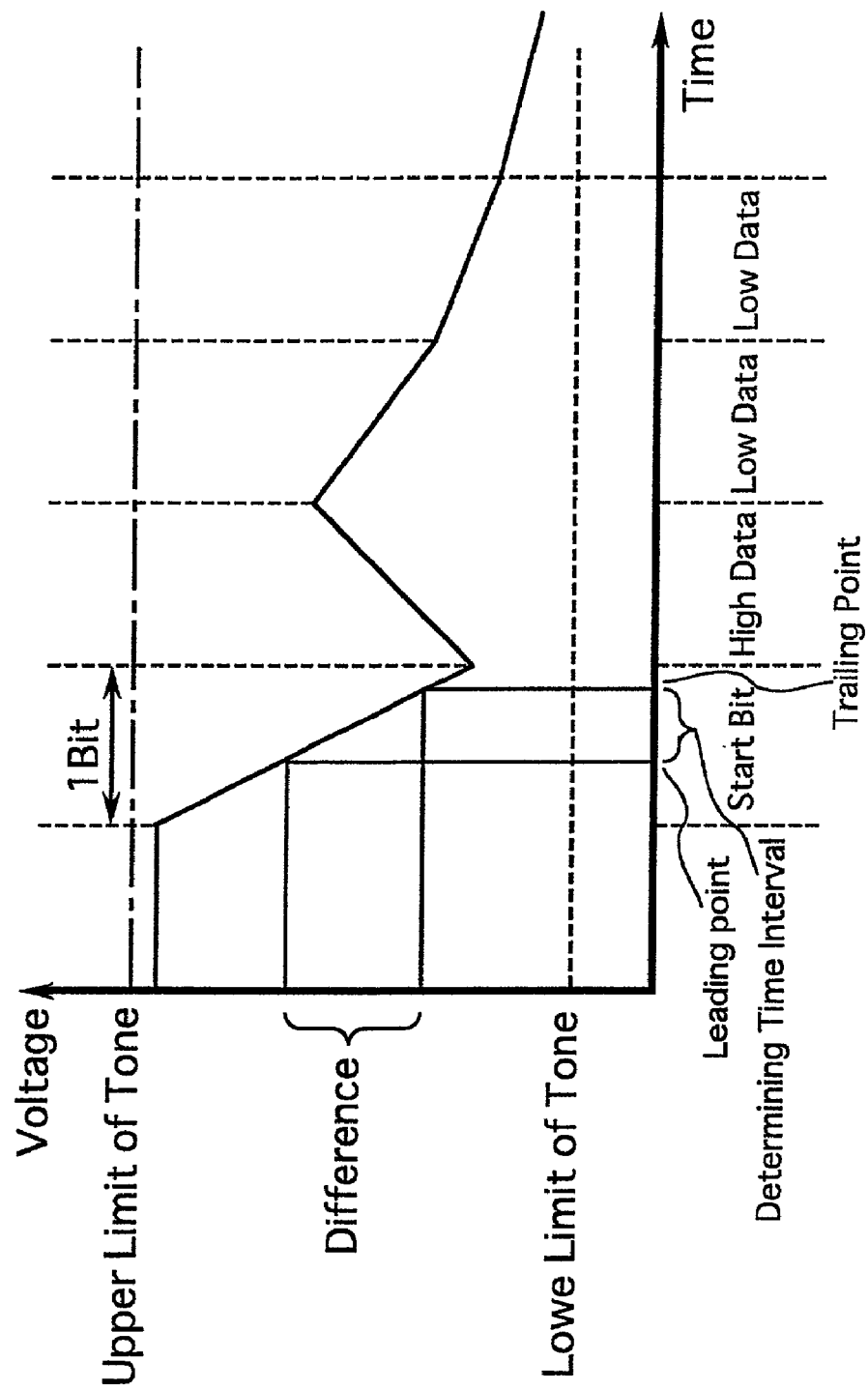
FIG. 6 is a graph used for describing a principle of detecting data information conveyed in the tone signal shown in FIG. 5.

FIG. 6 shows an example of the voltage characteristics corresponding to the integrals of the signal levels of the tones of the tone signal computed by the integral computing section 39*a*. The start bit element is a data element having no tone for the time period of one bit data element, thereby forming a rapid discharging slope of voltage level. The low data element is a data element having a plurality of tones repeated at a predetermined time interval, thereby forming a gentle discharging slope of voltage level. The high data element is a data element having one tone for the time period of one bit-data element, thereby forming a charging slope of voltage level. Furthermore, the signal level of a tone of a tone signal has an upper limit and a lower limit as shown in FIG. 6. The high data elements continue uninterruptedly, thereby resulting in that the signal level of the tone of the tone signal approaches to the upper limit. The low data elements, on the other hand, continue uninterruptedly, thereby resulting in that the signal level of the tone of the tone signal approaches to the lower limit.

As will be seen from FIG. 6, a bit data element conveyed in the tone signal can be determined by computing a slope formed by the signal levels of the integrals of the signal levels of the tones of the tone signal passed through by the crystal filter 37. The slope can be computed by a difference between two respective integrals of the signal levels of the tones of the tons signal computed by the data information computing section 39, at a predetermined detecting time interval starting at a leading point and ending at a trailing point. In other words, the bit data element, i.e., start bit element, low data element or high data element, can be detected in accordance with the slope.

The data determining section 39b is operated to sequentially compute differences between two respective integrals of the signal levels of the tones of the tone signal computed by the integral computing section 39a, at respective predetermined detecting time intervals each starting at a leading point and ending at a trailing point to acquire the bit data elements forming the data information indicative of the data information on the basis of the differences as shown in FIG. 6.

Two low data elements, however, continue uninterruptedly, thereby making it possible for a difference between two integrals of the signal levels of the tones of the tone signal computed at the detecting time interval starting at a leading point and ending at a trailing point to result in zero. Similarly, two high data elements continue uninterruptedly, thereby making it possible for a difference between two integrals of the signal levels of the tones of the tone signal computed at the detecting time interval starting at a leading point and ending at a trailing point to result in zero. When the difference thus computed results in zero, the data determining section 39b is therefore operated to determine the bit data element forming the tone signal indicative of the data information to be high data element or low data element, by judging if the signal level of the tone of the tone signal is detected in the vicinity of the upper limit or in the vicinity of the lower limit.

The compensating operation of the signal levels of the tones of the tone signal filtered through by the crystal filter 37 will be hereinlater described in detail.

The integral computing section 39a is operated to rectify the tone signal passed through by the crystal filter 37 and sequentially compute the integrals of the signal levels of the tones of the tone signal thus rectified at predetermined integration time intervals. The signal levels of the tones of the tone signal passed through by the crystal filter 37 may, however, fluctuate due to various factors including the temperature characteristics of the crystal filter 37 and the receiving state of the wireless receiving apparatus 102. The fluctuation of the signal levels of the tones of the tone signal may lead the integral computing section 39a to misidentify the tones of the tone signal and the data determining section 39b to fail to determine exact bit data elements forming the data information.

Figure 7:
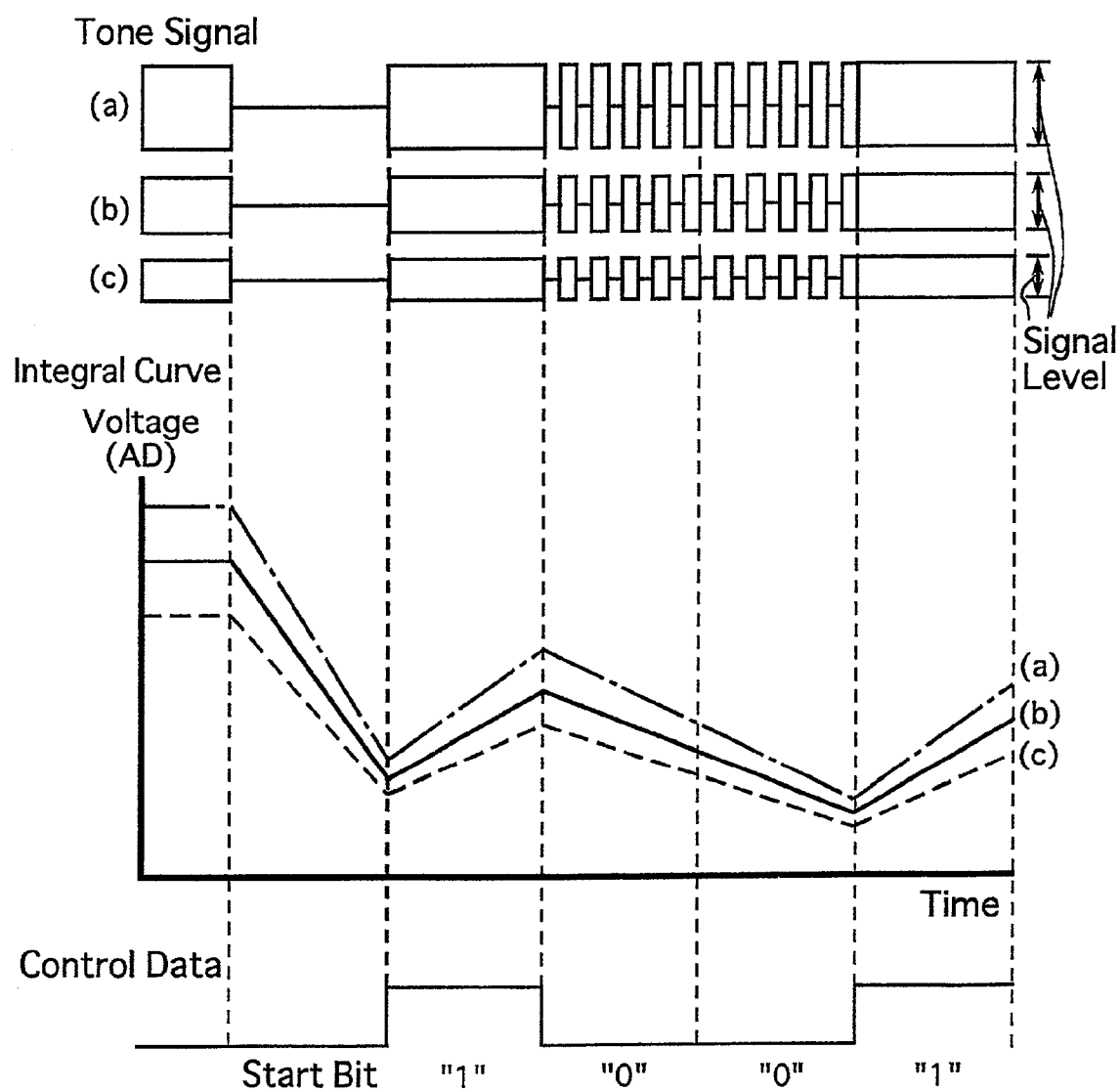
FIG. 7 is a set of schematic block diagrams and a graph showing fluctuations of voltage characteristics generated in accordance with the same tone signal shown in FIG. 5.

FIG. 7 shows the signal levels of the tones of the tone signals (a), (b), and (c) passed through by the crystal filter 37 and their respective integral curves. As will be seen from FIG. 7, tone signals (a), (b), and (c) are intended to convey the same bit data element forming the same data information, but have different signal levels, thereby resulting in forming different integral curves, respectively. The fluctuation of the signal levels of the tones of the tone signal may thus deteriorate the sensitivity of the wireless receiving apparatus 102 of recognizing the data information conveyed in the tone signal. The fluctuation of the signal levels of the tones of the tone signal, especially, makes it difficult for the data information computing section 39 to distinguish the start bit element from the low bit element. Furthermore, the data determining section 39b can recognize the integral of the signal level of the tone of the tone signal only if it is within a detectable range, which will be described later (see FIG. 9).

Figure 8:
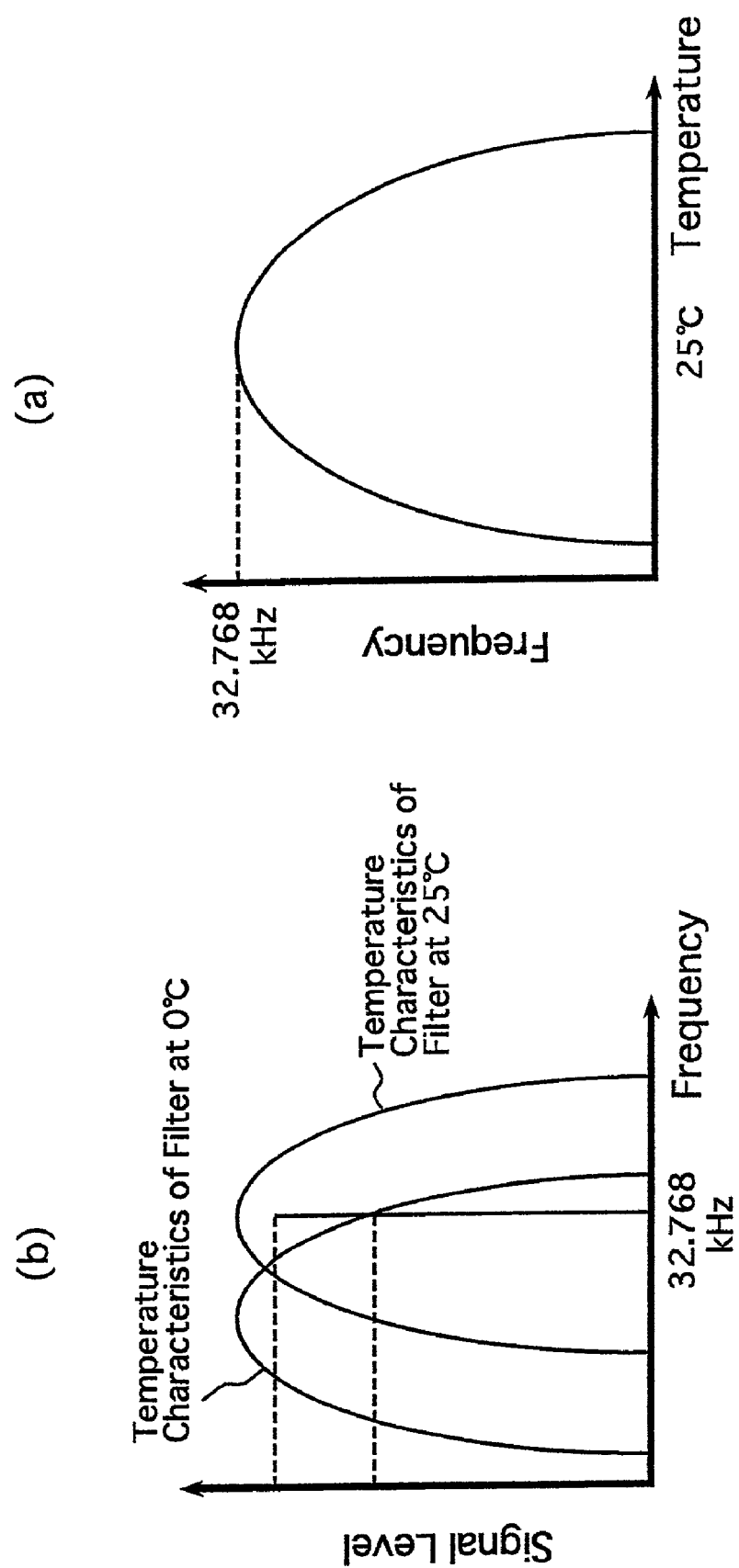
FIG. 8 is a set of graphs showing temperature characteristics of a crystal filter.

The temperature characteristics of the crystal filter 37 causes to fluctuate the signal levels of the tones of the tone signal to be filtered therethrough. FIG. 8 shows the temperature characteristics of the crystal filter 37 with respect to the frequency. The crystal filter 37 is designed to filter through the tone signal at 32.768 kHz. As shown in FIG. 8(a), the crystal filter 37 has the best sensitivity frequency of 32.768 kHz at 25° C. The best sensitivity frequency of the crystal filter 37, however, shifts below the signal frequency of 32.768 kHz at 0° C. The shift of the best sensitivity frequency of the crystal filter 37 causes the fluctuation of the signal levels of the tones of the tone signal to be filtered therethrough. In the similar manner to the crystal filter 37, the modulating section 26 of the wireless microphone transmission apparatus 101 may cause the fluctuation of the signal levels of the tones of the tone signal to be carried. The fluctuation of the signal levels of the tones of the tone signal thus caused will make it difficult for the wireless receiving apparatus 102 to accurately determine the bit data element forming the data information.

In order to solve the above drawback, the data determining section 39b is provided with a plurality of reference tables used for determining the integrals of the signal levels of the tones of the tone signal outputted by the integral computing section 39a. The data determining section 39b is operated to select one reference table from among the reference tables on the basis of the integrals of the signal levels of the tones of the tone signal outputted by the integral computing section 39a to compensate the integrals of the signal levels of the tones of the tone signal in accordance with the reference table at predetermined compensating time intervals, thereby making it possible for the data determining section 39b to correctly identify the integrals of the signal levels of the tones of the tone signal even if the signal levels of the tones of the tone signal may fluctuate as shown in FIG. 8(b). The data determining section 39b thus constructed can sequentially compute differences between two respective compensated integrals of the signal levels of the tones of the tone signal at respective data determining time intervals to acquire bit data elements forming the data information on the basis of the differences.

The data determining section 39b is operated to select one reference table from among the plurality of reference tables at the predetermined compensating time intervals. Once a start bit element is detected, the data determining section 39b can not select any other reference table until the all of the bit data elements of the data string following the start bit are received.

Figure 9:
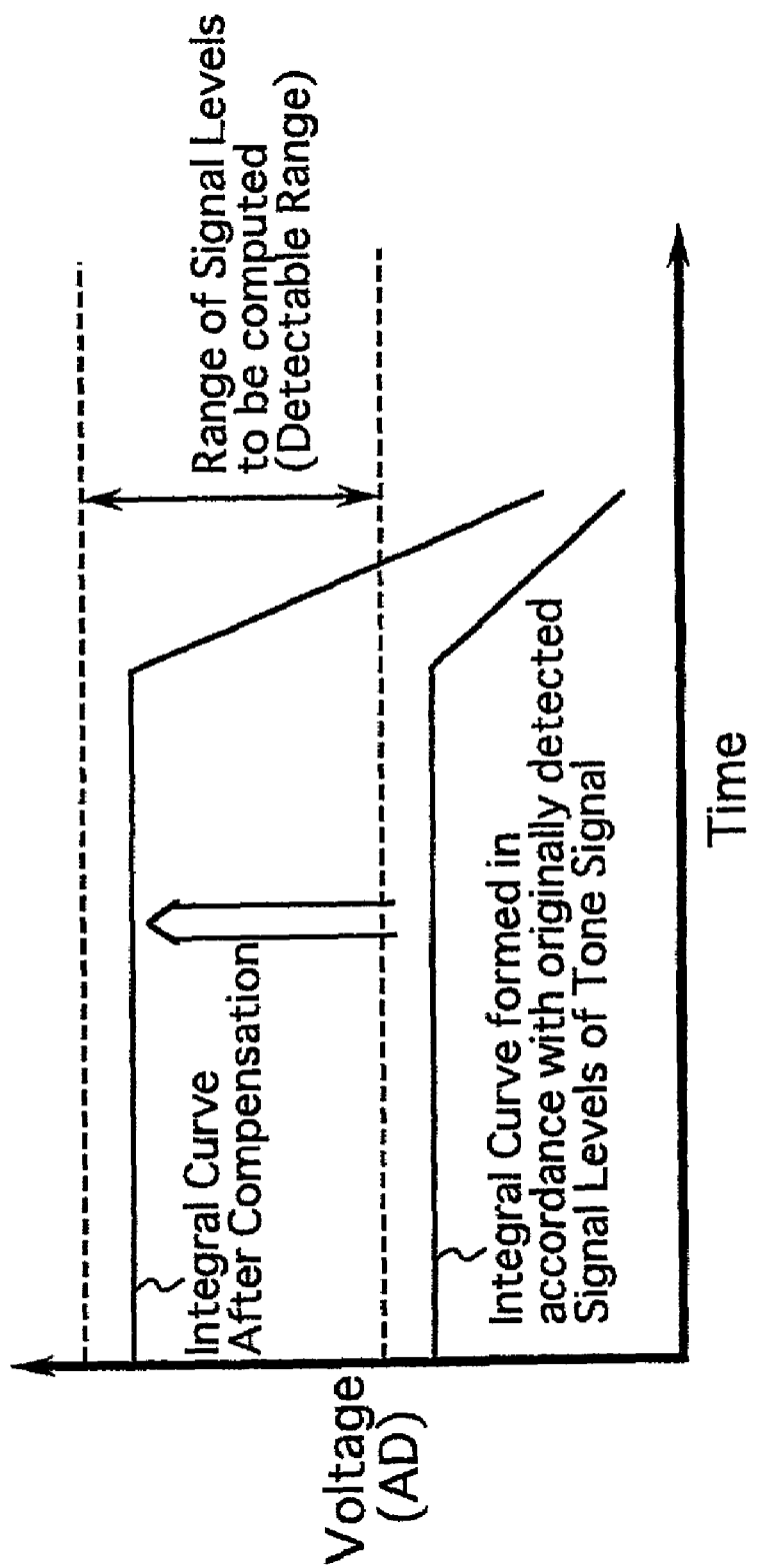
FIG. 9 is a graph used for describing the operation of compensating signal levels of tones of a tone signal performed by the wireless receiving apparatus 102 according shown in FIG. 3.

This means the data determining section 39b, however, cannot select any reference table no matter if the integral of the signal level of the tone of the tone signal outputted by the integral computing section 39a goes out of the detectable range shown in FIG. 9. In order to solve the drawback, the data determining section 39b of the present embodiment of the wireless receiving apparatus 102 according to the present invention, can instruct the integral computing section 39a to increment or change the voltage level applied to rectify the tone signal filtered through by the crystal filter 37 to compensate the signal level of the tone of the tone signal to be outputted to the data determining section 39b as shown in FIG. 9 to ensure that the data determining section 39b selects one reference table from among a plurality of reference tables on the basis of the compensated signal levels of the tones of the tone signal. The voltage level applied by the integral computing section 39a to rectify the tone signal filtered through by the crystal filter 37 will be hereinlater referred to as "detection lever".

This means that the data determining section 39b is operative to judge whether the integrals of the signal levels of the tones of the tone signal computed by the integral computing unit are in the detection level, and if the data information determining section 39b judges that the integrals of the signal levels of the tones of the tone signal computed by the integral computing unit are not in a predetermined detectable range, the data determining section 39b is operative to instruct the integral computing section 39a to compensate the integrals thus computed so that the integrals thus compensated are in the predetermined detectable range by incrementing the detection level, and the data determining section 39b is operative to sequentially compute differences between two respective integrals of the signal levels of the tones of the tone signal thus compensated by the integral computing section 39a, at respective second predetermined time intervals each starting at a leading point and ending at a trailing point to acquire the data information on the basis of the differences. The integral computing section 39a and the data determining section 39b constitute the integral computing unit and the data information computing unit according to the present invention.

The structure of a data string will be described hereinlater.

Data information can be converted into a data string having a bit length formed by a plurality of bit data elements. The bit data string includes two types consisting of a bit data string of 7-bit length and a bit data string of 13-bit length. A bit data string of 7-bit length and a bit data string of 13-bit length are hereinlater referred to as a "7-bit data string" and a "13-bit data string", respectively.

FIGS. 10 and 11 show a 7-bit data string and a 13-bit data string, respectively. As shown in FIG. 10 and 11, both of the 7-bit data string and 13-bit data string include a "start bit element", a "bit length identifier", "control data elements", and "BCC data elements", respectively.

The BCC data elements are data elements used for error detecting and allocated to the lower two bits of the 7-bit data string and the lower four bits of the 13-bit data string.

As described hereinbefore, the time period of 40 milliseconds is required to transmit one bit data element. Accordingly, the time period of 280 milliseconds is required to transmit the 7-bit data string and the time period of 520 milliseconds is required to transmit the 13-bit data string. Data information includes an urgent type of data information, which expects a quick response from the related constituent component, and a large type of data information, which contains relatively large volume of information. 7-bit data string is generally used to convey the urgent type of data information, and 13-bit data string is generally used to convey the large type of data information.

This means that the data generating section 22 is operated to input data information from the data inputting section 21, judge whether the type of the data information is the urgent type or the large type. Then, the data generating section 22 is operated to generate a 7-bit data string in response to the urgent type of data information to be urgently transmitted, and a 13-bit data string, on the other hand, in response to the large type of data information having large volume of information. Furthermore, the data information computing section 39 can judge whether the tone signal is 7-bit data string or 13-bit data string by checking the second bit of the data string.

The 7-bit data string includes sound level operation mode data used for controlling the signal level of the voice signal to be outputted by the wireless receiving apparatus 102 and control operation mode data used for controlling the control signal to be outputted by the wireless receiving apparatus 102. On the other hand, the 13-bit data string includes the above stated control operation mode data used for controlling the control signal to be outputted by the wireless receiving apparatus 102, and wireless microphone mode data used for transmitting the operating state of the wireless microphone transmission apparatus 101. As described above, both the 7-bit data string and the 13 bit-data string can convey control operation mode data used for controlling the control signal to be outputted by the wireless receiving apparatus 102. 7-bit data string and 13-bit data string are selectively generated to convey the control operation mode data, depending on the urgency of the control operation. The third bit of the 13-bit data string indicates the data mode, i.e., whether the data string conveys the control operation mode data or the wireless microphone mode data.

The wireless receiving apparatus 102 may further comprise terminals to be electrically connectable to an audio system including, for instance, a cassette deck and a CD player, and to audio-visual system including, for instance, a video deck. The wireless receiving apparatus 102 may output voice information and data information to the audio system and audio-visual system from the low-frequency amplifying section 36 and the control signal outputting section 41 through the terminals. The control operation mode data may include a plurality of control data used for controlling, for instance, an audio system such as a cassette deck and a CD player, and an audio-visual system such as a video deck. This means that the control operation mode data can be used, for instance, to control the power supply of the audio system and the audio-visual system, to control the sound level of a mixer, thereby adjusting a plurality of sound levels of voice and sound outputted from the audio system, to actuate a plurality of light switches, to lift or lower a screen, to control a slide in the audio-visual system, and to actuate an automatic broadcasting device, a sound device, and a display device constituting any one of the audio system and the audio-visual system.

The control operation mode data to be used for controlling the power supply of the wireless microphone transmission apparatus 101, hereinlater referred to as "power supply control data", is generated by the data generating section 22 in the following manner. The supply voltage of the wireless microphone transmission apparatus 101 is measured by a control section of the wireless microphone transmission apparatus 101, not shown, at predetermined intervals. The supply voltage of the wireless microphone transmission apparatus 101 thus measured is outputted to the data inputting section 21. The data generating section 22 is operated to generate a data string including the power supply control data on the basis of the data information including the supply voltage. The wireless receiving apparatus 102 has a display section, not shown, to display the supply voltage information.

As will be seen from the foregoing description, the data generating section 22 thus constructed is operated to input data information from the data inputting section 21, identify the type of the data information, and, in response to the type, generate a 7-bit data string or 1 13-bit data string on the basis of the data information. More specifically, the data generating section 22 is operated to generate a 7-bit data string in response to the urgent type of data information, and generate a 13-bit data string in response to the large type of data information.

The operation of the wireless microphone transmission apparatus 101 will be hereinlater described in detail.

The wireless microphone transmission apparatus 101 is operated to input data information in the following manner.

The data inputting section 21 is equipped with an operating section 50 for inputting data information therethrough. Once the data inputting section 21 inputs data information from the operation section 50, the data inputting section 21 is operated not to input any other data information until the wireless microphone transmission apparatus 101 transmits the radio microphone signal carrying the inputted data information to ensure that the inputted data information is transmitted.

Figure 12:
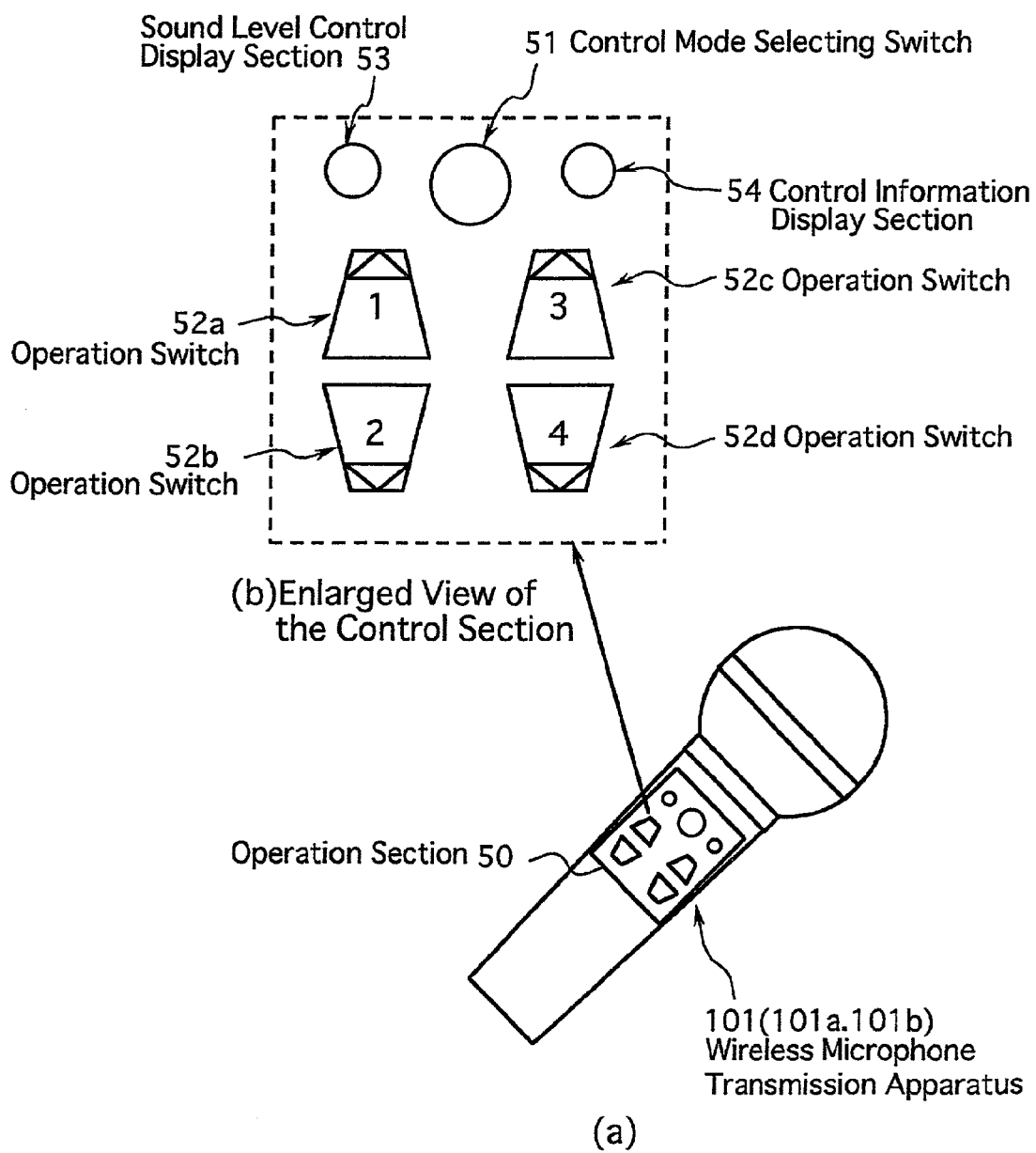
FIG. 12 is a schematic block diagram showing the wireless microphone transmission apparatus 101 shown in FIG. 2 and an enlarged view showing its operation section.
Figure 13:
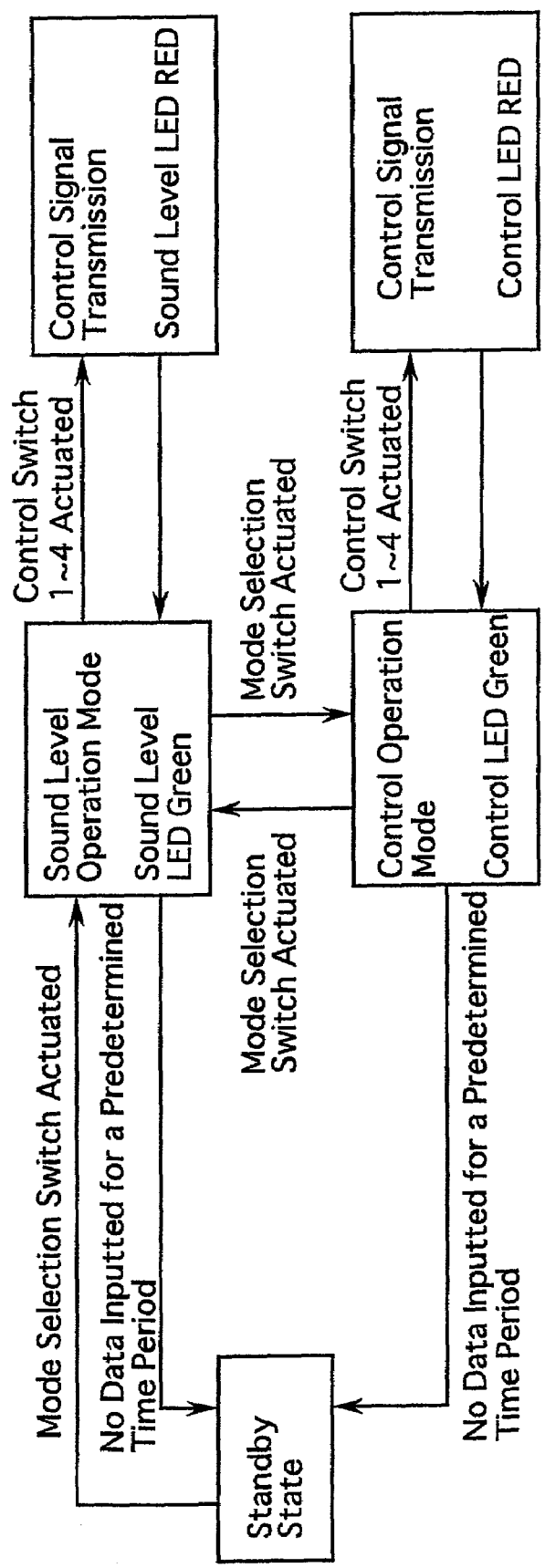
FIG. 13 is a block diagram showing the operation of an operation section of the wireless microphone transmission apparatus 101 shown in FIG. 2.

FIG. 12 shows an example of the operating section 50. FIG. 13 shows the operation of the operating section 50 shown in FIG. 12. The operating section 50 constitutes the sound level control unit according to the present invention.

As shown in FIG. 12, the operating section 50 has a mode selection switch 51, a plurality of operation switches 52a, 52b, 52c, and 52d, a sound level display section 53, and a control information display section 54. More specifically, the data information includes a plurality of control data elements. The mode selection switch 51 is adapted to input a control data element therethrough to select an operation mode from among a sound operation mode and a control operation mode. The operation switches 52a, 52b, 52c, and 52d are adapted to input a control data element therethrough in accordance with the operation mode. This means that the operation switches 52a, 52b, 52c, and 52d are, on the sound operation mode, adapted to input a control data element therethrough to control the sound level of the voice information to be outputted by the wireless receiving apparatus 102. The control data element used to control the sound level of the voice information will be hereinlater referred to as "sound level control data". The sound level display section 53 is adapted to light-on on the sound operation mode. The mode selection switch 51 constitutes the mode selection switch according to the present invention. The operation switches 52a, 52b, 52c, and 52d constitute the operation switches according to the present invention.

More particularly, the wireless communications system comprises two wireless microphone transmission apparatuses 101a and 101b, and two wireless receiving apparatuses 102a and 102b. The wireless receiving apparatuses 102a and 102b constitute the receiving means and the wireless receiving apparatus according to the present invention. The wireless microphone transmission apparatuses 101a and 101b are adapted to transmit radio microphone signals on respective microphone frequency channels carrying a voice signal indicative of voice information and a tone signal indicative of data information to the wireless receiving apparatuses 102a and 102b, respectively. The operation switches 52a and 52b of the wireless microphone transmission apparatuses 101a are, on the sound operation mode, adapted to input sound level control data therethrough to control the sound level of the voice information of the wireless receiving apparatus 102a, and the operation switches 52a and 52b of the wireless microphone transmission apparatuses 101b are adapted, on the sound operation mode, to input sound level control data therethrough to control the sound level of the voice information of the wireless receiving apparatus 102b. On the other hand, the operation switches 52c and 52d of the wireless microphone transmission apparatuses 101a are, on the sound operation mode, adapted to input sound level control data therethrough to control the sound level of the voice information of the wireless receiving apparatus 102b, and the operation switches 52c and 52d of the wireless microphone transmission apparatuses 101b are adapted, on the sound operation mode, to input sound level control data therethrough to control the sound level of the voice information of the wireless receiving apparatus 102a.

Furthermore, the operation switches 52a, 52b, 52c, and 52d are, on the control operation mode, adapted to input control data therethrough to control the operation (other then the sound level) of the wireless receiving apparatus 102. The control information display section 54 is adapted to light-on on the control operation mode. The data used to control the operation will be hereinlater referred to as "operation control data".

Referring to FIG. 13, the operation of the operating section 50 will be hereinlater described. The mode selection switch 51 and operation switches 52a, 52b, 52c, and 52d are usually in the standby state for waiting for data to be inputted therethrough. The mode selection switch 51 is firstly pressed, thereby resulting in that the sound level display section 53 is lighted-on, the operation section 50 is switched to the sound operation mode, and the operation switches 52a, 52b, 52c, and 52d become ready for inputting sound control data therethrough. The mode selection switch 51 is secondly pressed on the sound operation mode, thereby resulting in that the control information display section 53 is lighted-on, the operation section 50 is switched to the control operation mode, and the operation switches 52a, 52b, 52c, and 52d become ready for inputting control operation data therethrough. In this manner, the operation mode of the operation section 50 is switched from one operation mode to the other operation mode whenever the mode selection switch 51 is pressed.

The operation section 50 is, on the other hand, operated to return to the standby state, if no data is inputted by the mode selection switch 51, nor by any one of the operation switches 52a, 52b, 52c, and 52d for a predetermined waiting time period.

The operation of the operation section 50 will be described in more detail. The operation section 50 is provided with a timer for counting a time elapsed in which no data is inputted. The timer is initialized to zero whenever data is inputted by the mode selection switch 51, or any one of the operation switches 52a, 52b, 52c, and 52d therethrough. The timer is set for the predetermined waiting time period. This leads to the fact that he operation section 50 is operated to return to the standby state if the timer expires without data being inputted for more than the waiting time period.

The data generating section 22 is operated to input the control data thus inputted by the operation switches 52a, 52b, 52c, and 52d to generate a data string to be outputted to the tone signal generating section 23.

Once the data inputting section 21 inputs data information from the operation section 50, the data inputting section 21 thus constructed does not input any other data information until the wireless microphone transmission apparatus 101 transmits the radio microphone signal carrying the inputted data information to ensure that data information is transmitted.

Furthermore, the data inputting section 21 is adapted to input control data information from a control section, not shown. As described hereinlater, the control data includes supply voltage information of the wireless microphone transmission apparatus 101. In the case that the data inputting section 21 inputs data information from the operation section 50 while the control data information inputted from the control section is still being processed in the wireless microphone transmission apparatus 101, the process of the control data is suspended until the wireless microphone transmission apparatus 101 transmits the radio microphone signal carrying the data information inputted from the operation section 50 to ensure that the inputted data information is transmitted.

The operation of transmitting a radio microphone signal on a predetermined wireless microphone frequency channel carrying a voice signal indicative of voice information and a tone signal indicative of data information will be hereinlater described in detail.

Figure 14:
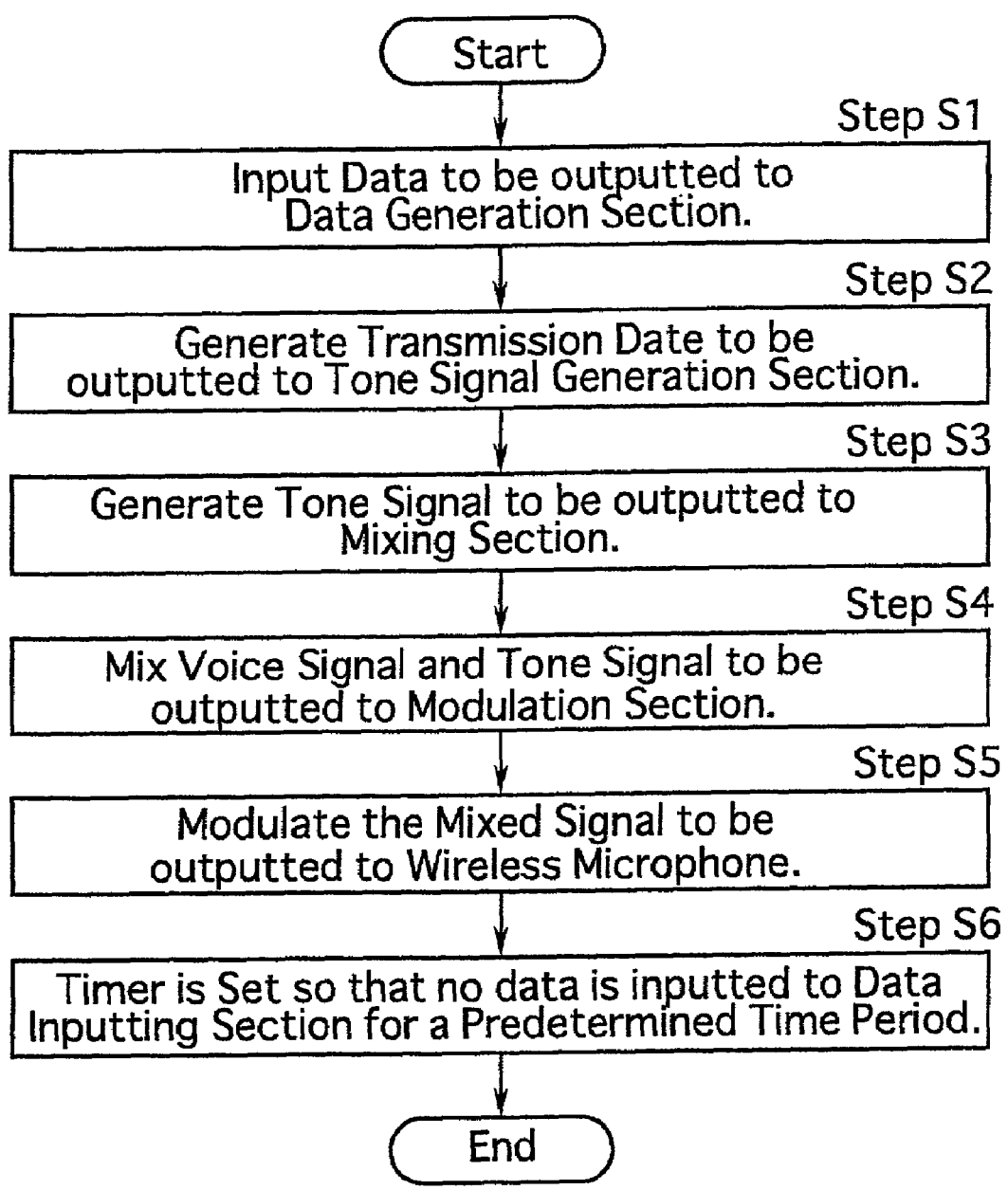
FIG. 14 is a flowchart showing the operation of the wireless microphone transmission apparatus 101 shown in FIG. 2.

FIG. 14 shows a flowchart showing the operation of transmitting a radio microphone signal on a predetermined wireless microphone frequency channel carrying a voice signal indicative of voice information and a tone signal indicative of data information performed by the wireless microphone transmission apparatus 101.

The power switch of the wireless microphone transmission apparatus 101, not shown, is turned on and the data inputting section 21 is ready to receive data information.

In the step S1, the data inputting section 21 is operated to input data information from the operation section 50 or the control section, not shown, to be outputted to the data generating section 22. If the data information is inputted from the operation section 50 while data information inputted from the control section is being processed, the data information inputted from the operation section 50 is given priority to the data information inputted from the control section. The step S1 goes forward to the step S2 wherein the data generating section 22 is operated to identify the type of the data information to selectively generate a 7-bit data string and a 13-bit data string in response to the type of and on the basis of the data information thus inputted, and output the data string thus generated to the tone signal generating section 23.

The step S2 goes forward to the step S3 wherein the tone signal generating section 23 is operated to generate the tone signal indicative of the data information on the basis of the data string inputted by the data generating section 22 and output the tone signal thus generated to the mixing section 24.

The step S3 goes forward to the step S4 wherein the mixing section 24 is operated to input the voice signal from the voice inputting section 20 and the tone signal from the tone signal generating section 23 to mix the voice signal and the tone signal to generate a microphone signal carrying the voice signal and the tone signal, and output the microphone signal thus generated to the modulating section 26. The step S4 goes forward to the step S5 wherein the modulating section 26 is operated to input the microphone signal from the mixing section 24 and the carrier signal from the oscillation section 25 to modulate the microphone signal with the carrier signal to generate a radio microphone on a predetermined wireless microphone frequency channel carrying the voice signal and the tone signal. The wireless microphone frequency channel is uniquely allocated to the wireless microphone transmission apparatus 101. Then, the high-frequency amplifying section 27 is operated to receive the radio microphone signal on the wireless microphone frequency from the modulating section 26 to amplify the radio microphone signal, and output the radio microphone signal thus amplified to the transmission antenna 28. The transmission antenna 28 is operated to transmit the radio microphone signal on the wireless microphone frequency channel carrying the voice signal and the tone signal to the wireless receiving apparatus 102.

The step S5 goes forward to the step S6 wherein a timer is set to ignore any data input for a predetermined time period.

As will be seen from the foregoing description, the wireless microphone transmission apparatus 101 thus constructed is operative to transmit the radio microphone signal on the wireless microphone frequency carrying the voice signal and the tone signal to the wireless receiving apparatus 102. The radio microphone signal is allocated to the wireless microphone transmission apparatus 101 and the wireless receiving apparatus 102.

The operation of receiving a radio microphone signal on a predetermined microphone frequency channel carrying a voice signal indicative of voice information and a tone signal indicative of data information will be hereinlater described in detail.

Figure 15:
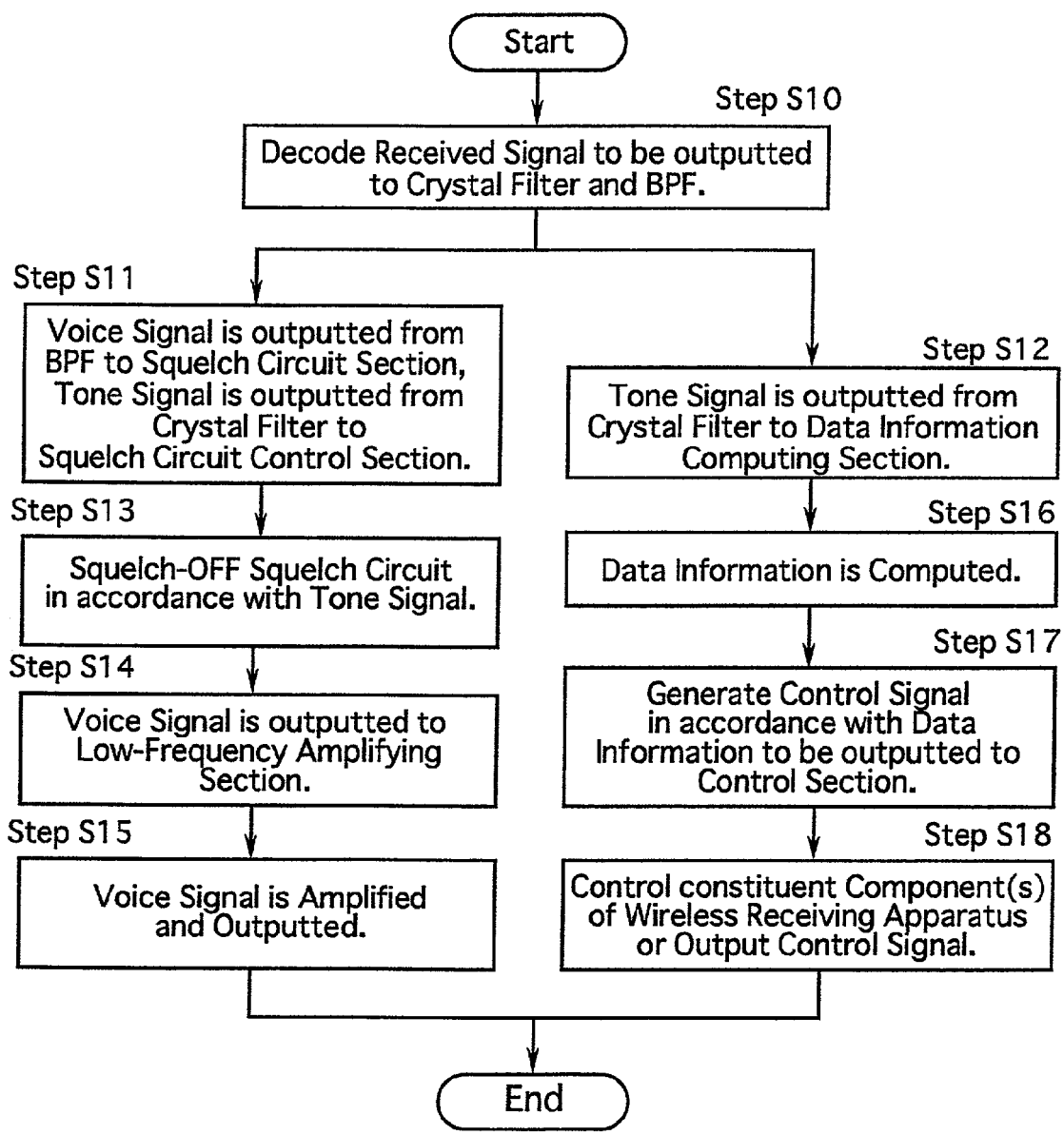
FIG. 15 is a flowchart showing the operation of the wireless receiving apparatus 102 shown in FIG. 3.

FIG. 15 shows a flowchart showing the operation of receiving a radio microphone signal on a predetermined wireless microphone frequency channel carrying a voice signal indicative of voice information and a tone signal indicative of data information performed by the wireless receiving apparatus 102.

The power switch of the wireless receiving apparatus 102, not shown, is turned on and the wireless receiving apparatus 102 is in progress of receiving a radio microphone signal on a predetermined wireless microphone frequency channel carrying a voice signal indicative of voice information and a tone signal indicative of data information performed by the wireless receiving apparatus 102.

In the step S10, the decoding section 33 is operated to decode the received radio microphones signal to generate a microphone signal to be outputted to the band pass filter 34 and the crystal filter 37. The step S10 then goes forward to the step S11 and step S12.

In the step S11, the band pass filter 34 is operated to filter through a voice signal from the microphone signal, and output the voice signal thus filtered through to the squelch circuit section 35. In the step S12, the crystal filter 37 is operated to filter through a tone signal from the microphone signal, and output the tone signal thus filtered through to the squelch circuit control section 38 and the data information computing section 39. The step S11 goes forward to the step S13, and the step S12 goes forward to the step S16.

The operation of outputting voice information and data information is controlled in the following manner.

In the step S13, the squelch circuit control section 38 is operated to squelch-off the squelch circuit section 35 to pass through the voice signal in response to the signal level of the tone of the tone signal inputted thereto. The squelch circuit control section 38 is, on the other hand, operated to squelch-on the squelch circuit section 35 if no tone signal is inputted thereto or the signal level of the tones of the tone signal inputted thereto is smaller than a predetermined threshold value.

The step S13 goes forward to the step S14 wherein the squelch circuit section 35 is operated to output the voice signal to the low-frequency amplifying section 36. The step S14 goes forward to the step S15 wherein the low-frequency amplifying section 36 is operated to amplify the voice signal and output the voice signal thus amplified thereto.

In the step S16, the data information computing section 39 is operated to compute bit data elements forming the data information in accordance with the tone signal filtered through by the crystal filter 37. The operation of computing bit data elements forming data information will be described in detail later.

The step S16 goes forward to the step S17 wherein the information computing section 39 is operated to determine and construct the data elements, i.e., the control signal indicative of the data information on the basis of the bit data elements thus computed and output the control signal indicative of the data information thus computed to the control section 40. The step S17 goes forward to the step S18 wherein the control section 40 is operated to control related constituent components of the wireless receiving apparatus 102 on the basis of the control signal indicative of the data information or output the control data to the control signal outputting section 41, to be outputted to outside components, not shown.

As will be seen from the foregoing description, the wireless receiving apparatus 102 thus constructed is operative to receive the microphone signal on the wireless microphone frequency carrying the voice signal and the tone signal transmitted by the wireless microphone transmission apparatus 101.

The operation of computing bit data elements forming data information performed by the data information computing section 39 will be hereinlater described in detail.

Figure 16:
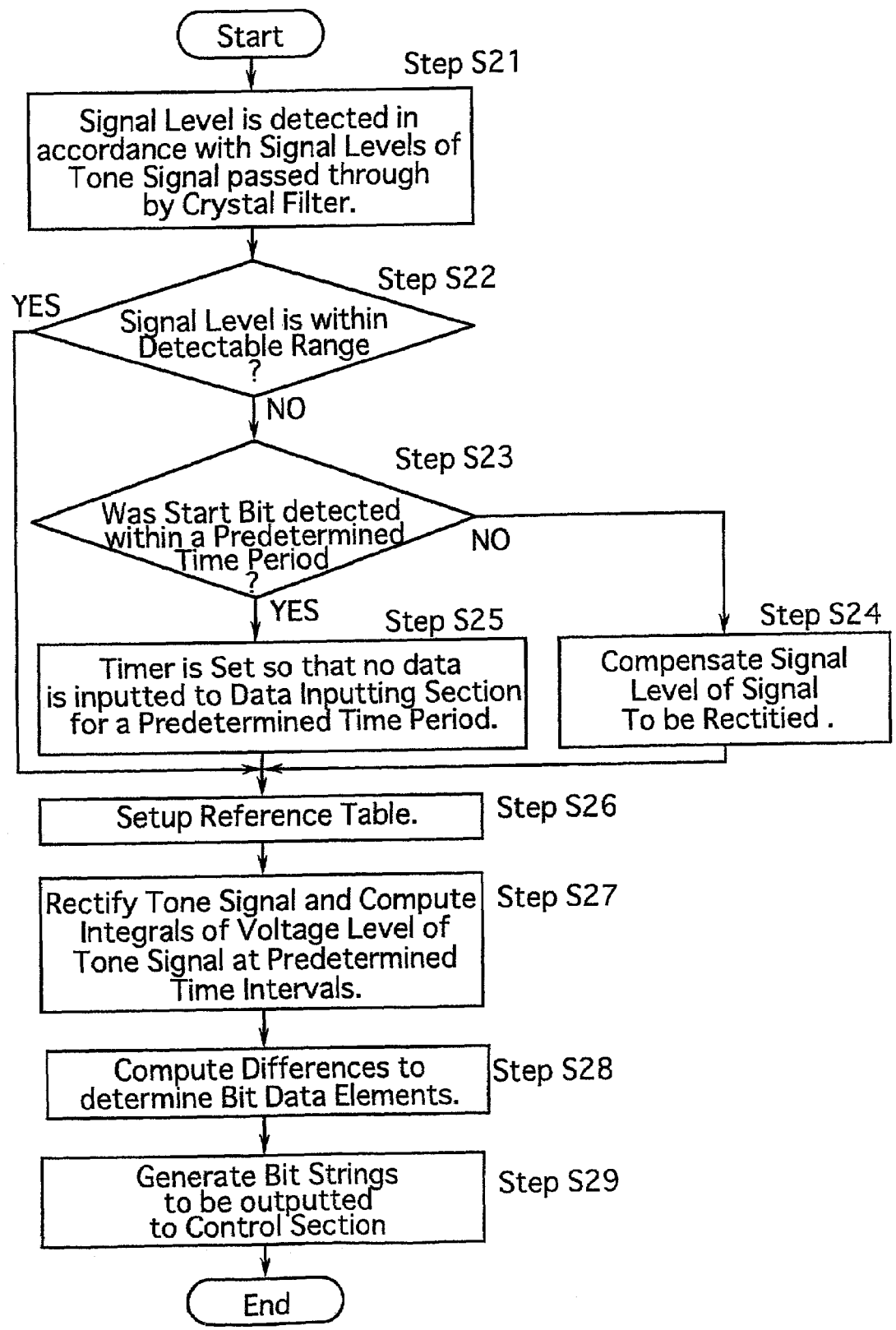
FIG. 16 is a flowchart showing the operation of computing bit data elements forming data information performed by the wireless receiving apparatus 102 shown in FIG. 3.

FIG. 16 shows a flowchart showing the operation of computing bit data elements forming data information performed by the data information computing section 39. FIG. 17 shows voltage characteristics corresponding to the integrals of the signal levels of the tones of the tone signal used for describing the operation of computing bit data elements.

In the step S21, the crystal filter 37 is operated to filter through the tone signal from the microphone signal to output the tone signal thus filtered to the data information computing section 39. The data information computing section 39 is operated to judge the whether the signal level of the tone signal thus filtered is within the detectable range. If the data information computing section 39 judges that the signal level of the tone signal is within the detectable range, the step S22 goes directly to the step S26. If, on the other hand, the data information computing section 39 judges that the signal level of the tone signal is out of the detectable range, the step S22 goes forward to the step S23 wherein the data information computing section 39 is operated to judge whether any start bit element was detected within a predetermined data detecting time period. If the data information computing section 39 judges that no start bit element was detected within the predetermined data detecting time period, the step S23 goes forward to the step S24 wherein the data information computing section 39 is operated to increment the voltage level, i.e., detection level, applied to rectify the tone signal by a predetermined increasing ratio. The step S24 goes forward to the step S26. If the data information computing section 39 judges that the start bit element was detected within the predetermined data detecting time period, the step S23 goes to the step S25 wherein the data information computing section 39 is operated to set a timer, not shown, for a time period required for transmitting all of the bit data elements of the data string following the start bit, and not to change the detection level of the data information computing section 39 until the aforesaid time period elapses.

Figure 18:
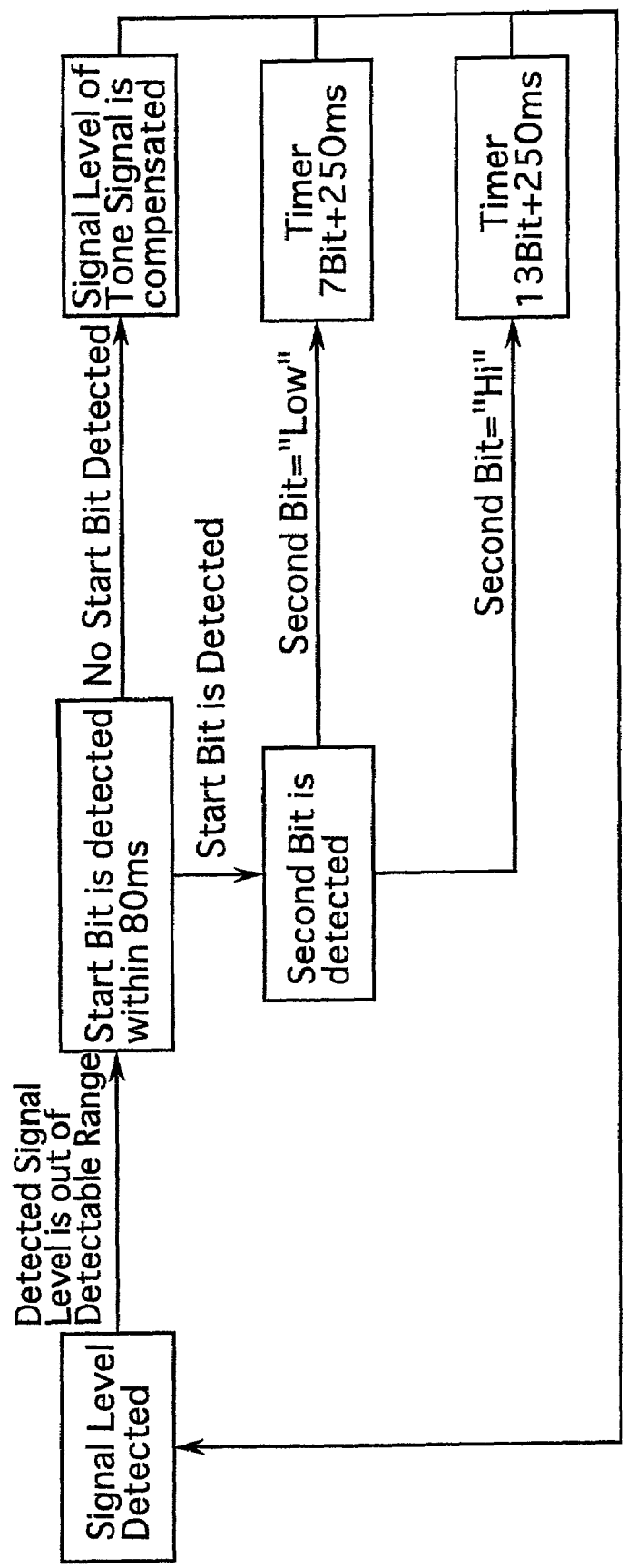
FIG. 18 is a schematic block diagram used for describing a timer setting performed by the wireless receiving apparatus 102 shown in FIG. 3.

FIG. 18 shows the operation of setting the timer. More specifically, in the present embodiment of the wireless receiving apparatus 102 according to the present invention, the data information computing section 39 includes the integral computing section 39a and the data determining section 39b. The data determining section 39b is operated to judge whether the data string following the start bit is a 7-bit data string or a 13-bit data string by checking the bit length identifier in the second bit data element of the data string upon or after reading the second bit data element. If the data determining section 39b judges that the data string following the start bit is a 7-bit data string, the data determining section 39b is operated to set the timer, not shown, for the time period of seven bits plus 250 milliseconds, and if the data determining section 39b judges that the data string following the start bit is a 13-bit data string, the data determining section 39b is operated to set the timer, not shown, for the time period of thirteen bits plus 250 milliseconds as shown in FIG. 18.

Due to the discharging characteristics caused by the start bit element and the low data element, the data determining section 39b cannot continuously detect bit data elements. It takes approximately 250 milliseconds until the voltage level of the data determining section 39b returns to the original level. For this reason, 250 milliseconds is added to the time period of respective bits.

In the step S26, the data determining section 39b is operated to select one reference table from among a plurality of reference tables. Then step S26 goes forward to the step S27 wherein the integral computing section 39a is operated to rectify the tone signal filtered through by the crystal filter 37 and compute the integral of the signal levels of the tones of the tone signal at predetermined integration time intervals. This means that the integral computing section 39a is operated to read the voltage level of the tone signal thus rectified by means of an AD converter, not shown. In the present embodiment of the wireless receiving apparatus 102 according to the present invention, the integral computing section 39a is operated to read the voltage level at integration time intervals of 5 milliseconds as shown in FIG. 17.

The step S27 goes forward to the step S28 wherein the data determining section 39b is operated to compute differences between two respective integrals of the signal levels of the tones of the tone signal computed by the integral computing section 39a, at respective predetermined data determining time intervals each starting at a leading point and ending at a trailing point to acquire bit data elements forming the data information on the basis of the differences. In the present embodiment of the wireless receiving apparatus 102 according to the present invention, one data determining time interval is four times of the integration time intervals, i.e., 20 milliseconds, each starting at a leading point and ending at an ending point as shown in FIG. 17. This means that the data determining section 39b is operated to sequentially compute differences between two respective integrals of the signal levels of the tones of the tone signal at respective data determining time intervals of 20 milliseconds starting at a starting point and ending at an ending point, and then sequentially identify bit data elements in accordance with the respective differences.

The operation of determining bit data elements performed by the data determining section 39b will be hereinlater described in detail.

The data determining section 39b is operated to sequentially compute the differences at the data determining time intervals of 20 milliseconds, for every 10 millisecond as shown in FIG. 17. This means that the data determining section 39b is operated to sequentially judge bit data elements in accordance with the respective differences computed for 20 milliseconds using the selected reference table to generate judging results each indicating any one of a start bit element, a low data element, and a high data element, for every 10 millisecond. As described hereinbefore, the time period required to transmit one bit data element is 40 milliseconds. This leads to the fact that the data determining section 39b is operated to judge each bit data element for four times. In other words, the data determining section 39b is operated to generate four judging results for every bit data element as shown in FIG. 17. The data determining section 39b is operated to sequentially determine each bit data element by selecting one judging result from among four respective judging results by majority as shown in FIG. 17. More specifically, the data determining section 39b may especially consider second and third judging results among four respective judging results to determine respective bit data element.

The step S28 goes forward to the step S29 wherein the data determining section 39b is operated to reconstruct bit data elements forming the tone signal indicative of the data information, and output the bit data elements thus reconstructed to the control section 40.

As will be seen from the foregoing description, the wireless receiving apparatus 102 according to the present invention thus constructed is operated to sequentially determine bit data elements forming the tone signal indicative of the data information. Once a start bit element is detected, the wireless receiving apparatus 102 is operated to detect the rest of the bit data elements following the start bit element for every 40 milliseconds. Also, the wireless receiving apparatus 102 is operated to detect the second bit data element directly following the start bit element 50 milliseconds after the detection of the start bit element in consideration of detection time lag.

The operation of detecting the power-off state of the wireless microphone transmission apparatus 101 performed by the wireless receiving apparatus 102 will be described hereinlater with reference to FIG. 19.

The turn-off operation of the power switch of the wireless microphone transmission apparatus 101 causes the wireless microphone transmission apparatus 101 to cease to transmit any tone signal. The turn-off and then immediate turn-on operation of the wireless microphone transmission apparatus 101, on the other hand, causes the wireless microphone transmission apparatus 101 to transmit a tone signal having a start bit element and a high data element. The wireless receiving apparatus 102 may misidentify the absent of the tone signal caused by the turn-off operation as a start bit element. Accordingly, the wireless receiving apparatus 102 is operated to judge the turn-off operation of the wireless microphone transmission apparatus 101 if two continuous start bit elements are detected.

Figure 19:
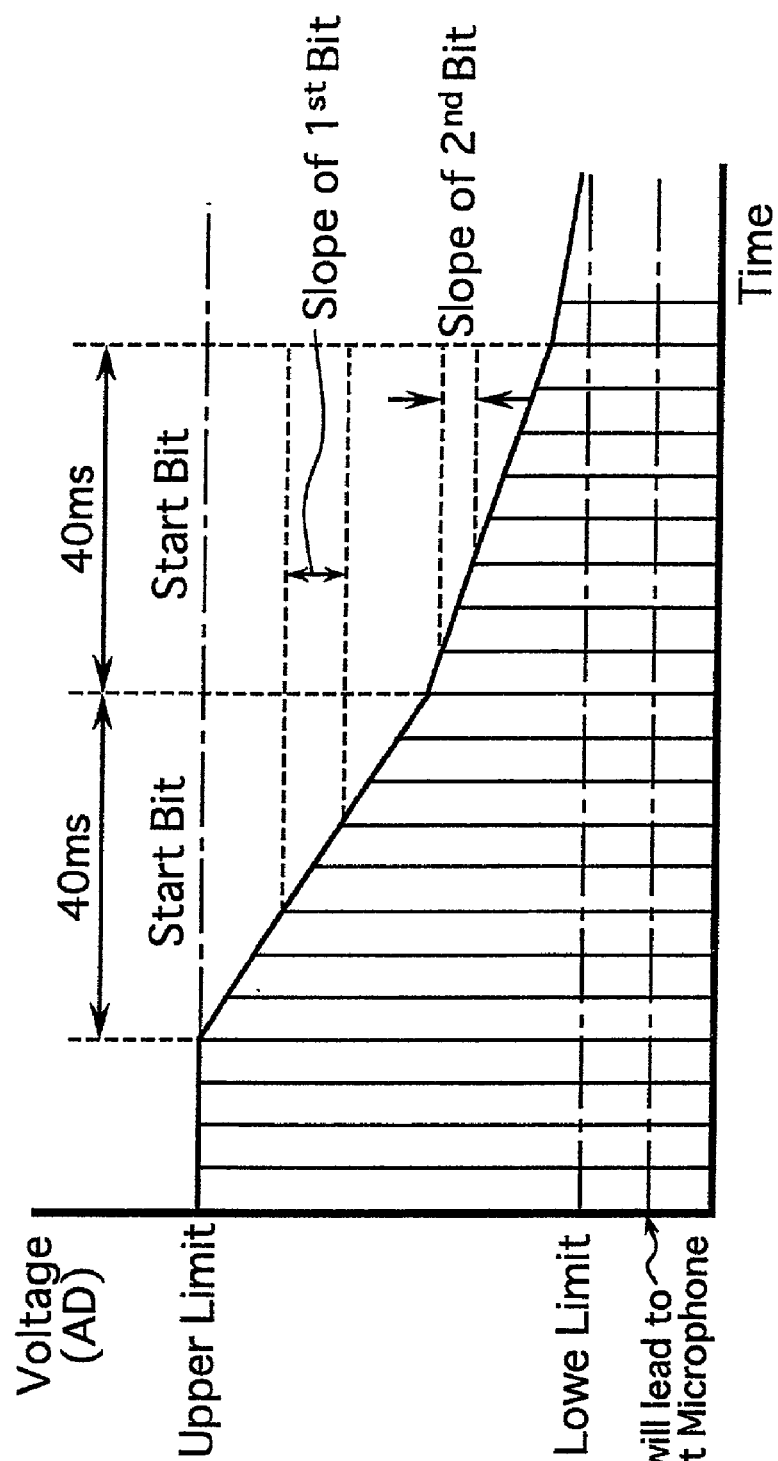
FIG. 19 is a graph used for describing the turn-OFF operation of a wireless microphone transmission apparatus performed by the wireless receiving apparatus 102 shown in FIG. 3.

As shown in FIG. 19, the second start bit element of the two continuous start bit elements generates a gentle slope in the voltage characteristics, thereby making it difficult for the conventional wireless receiving apparatus to distinguish the second start bit element directly following the start bit element from a low bit data element.

The present embodiment of the wireless receiving apparatus 102 according to the present invention is operated to judge and determine the second bit data element in the manner above described. In addition, the wireless receiving apparatus 102 is operated to judge the second bit data element on the basis of a difference between the first bit data element and the second bit data element. The difference between two start bit elements is slightly different from the difference between the start bit element and the low bit data element. This means that the wireless receiving apparatus 102 is operated to detect the second bit data element in the aforesaid two judging operations to ensure that the turn off operation of the wireless microphone transmission apparatus 101 is detected. Furthermore, the reference tables include predetermined values used for judging and determining the turn-off operation of the wireless microphone transmission apparatus 101.

As will be seen from the foregoing description, in the present embodiment of the wireless communications system 100 according to the present invention, the wireless microphone transmission apparatus 101 can transmit a radio microphone signal carrying a voice signal indicative of voice information and a tone signal indicative of data information to the wireless receiving apparatus 102, and the wireless receiving apparatus 102 can receive a radio microphone signal carrying a voice signal indicative of voice information and a tone signal indicative of data information.

In the present embodiment of the wireless receiving apparatus 102 according to the present invention, the data information computing section 39 can determine bit data elements on the basis of the integrals of the signal levels of the tones of the tone signal.

The signal level of the tone signal may fluctuate beyond the detectable range due to, for example, the malfunction of a constituent component of the wireless microphone transmission apparatus 101 or the wireless receiving apparatus 102. In the wireless receiving apparatus 102 according to the present invention, the data information computing section 39 can compensate the signal levels of the tones of the tone signal if the signal level of the tone of the tone signal is out of the detectable range, thereby enabling to accurately determine data bit elements.

In the present embodiment of the wireless receiving apparatus 102 according to the present invention, the data information computing section 39 is provided with a plurality of reference tables, and can select one reference table from among the them in response to the detected signal level, to determine the bit data elements on the basis of the integrals of the signal levels of the tones of the tone signal, using the selected reference table. Furthermore, the data information computing section 39 may change the detection level in response to the detected signal level so as to maintain the signal levels of the tones of the tone signal to a certain level, thereby enabling to constantly determine bit data elements.

The present embodiment of the wireless receiving apparatus 102 according to the present invention can selectively receive any one of radio microphone signals on two frequency channels allocated to two respective wireless microphone transmission apparatuses 101a and 101b. Alternatively, only one frequency channel may be allocated to the wireless receiving apparatus 102.

Moreover, three or more frequency channels may be allocated to the wireless receiving apparatus 102. As described hereinbefore, the decoding section 33, the band pass filter 34, the squelch circuit section 35, the low-frequency amplifying section 36, the crystal filter 37, the squelch circuit control section 38, the data information computing section 39, the control section 40, and the control signal outputting section 41 of the wireless receiving apparatus 101 must be uniquely dedicated to each frequency channel. This means that the same number of sets of the decoding section 33, the band pass filter 34, the squelch circuit section 35, the low-frequency amplifying section 36, the crystal filter 37, the squelch circuit control section 38, the data information computing section 39, the control section 40, and the control signal outputting section 41 must be mounted in the case that additional one ore more frequency channels are allocated to the wireless receiving apparatus 102.

Figure 20:
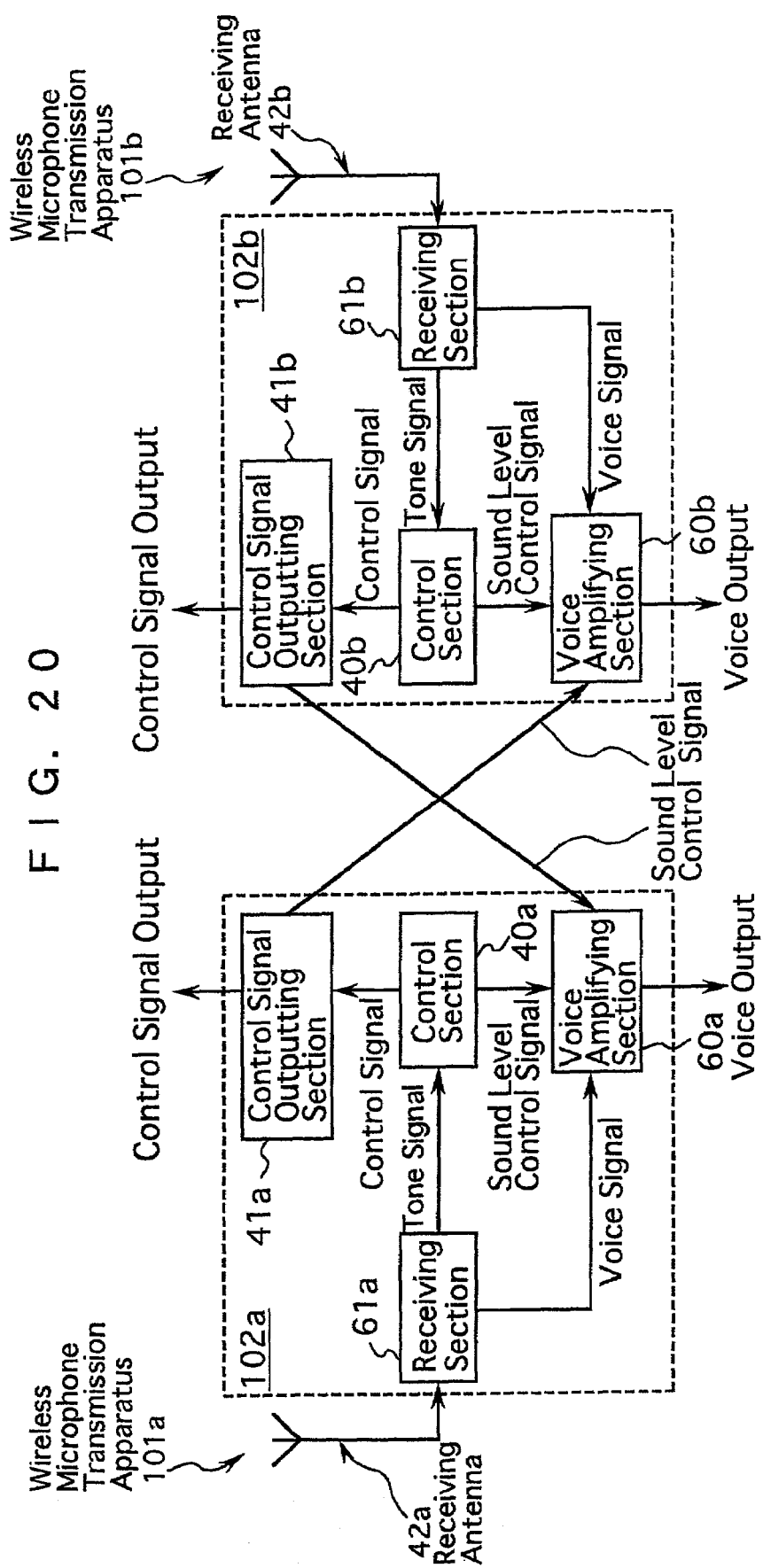
FIG. 20 is a block diagram showing the voice output operation of wireless receiving apparatuses 102a and 102b according to the present invention.
Figure 21:
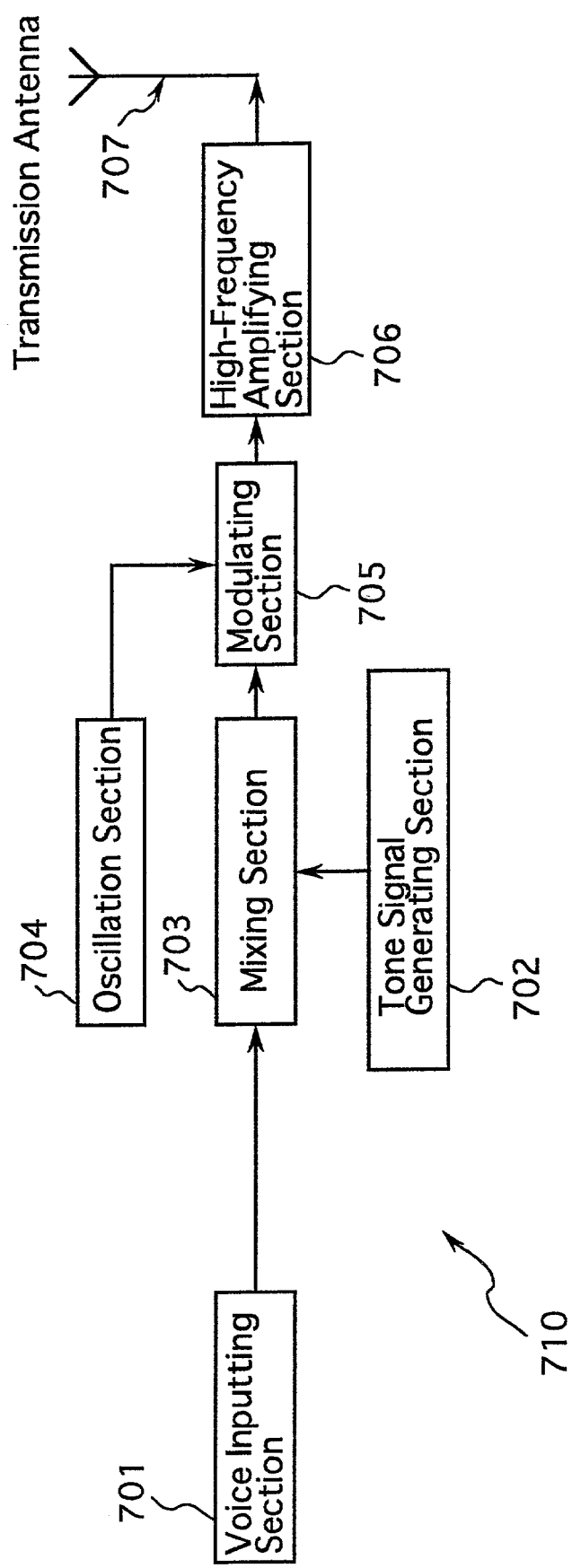
FIG. 21 is a schematic block diagram showing a conventional wireless microphone transmission apparatus 710.
Figure 22:
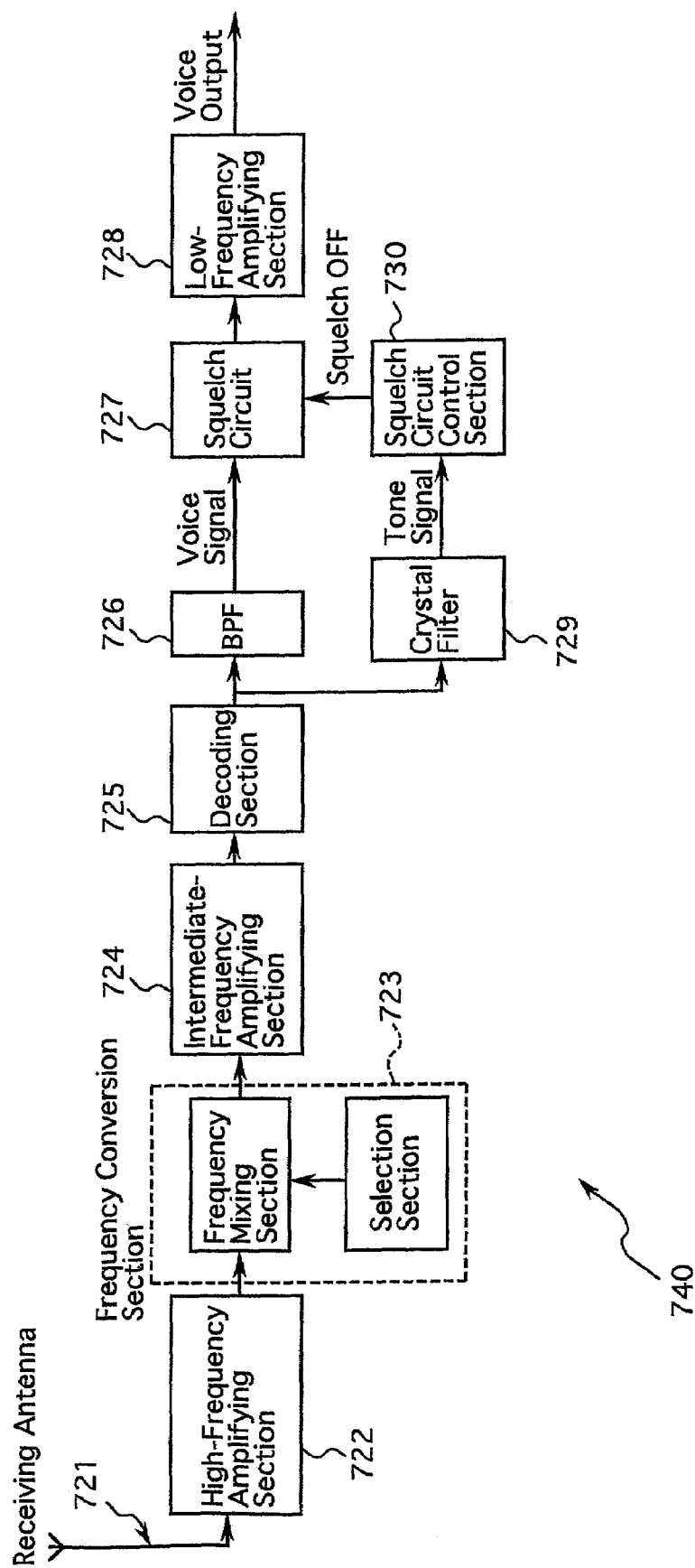
FIG. 22 is a schematic block diagram showing a conventional wireless receiving apparatus 740.
Figure 23:
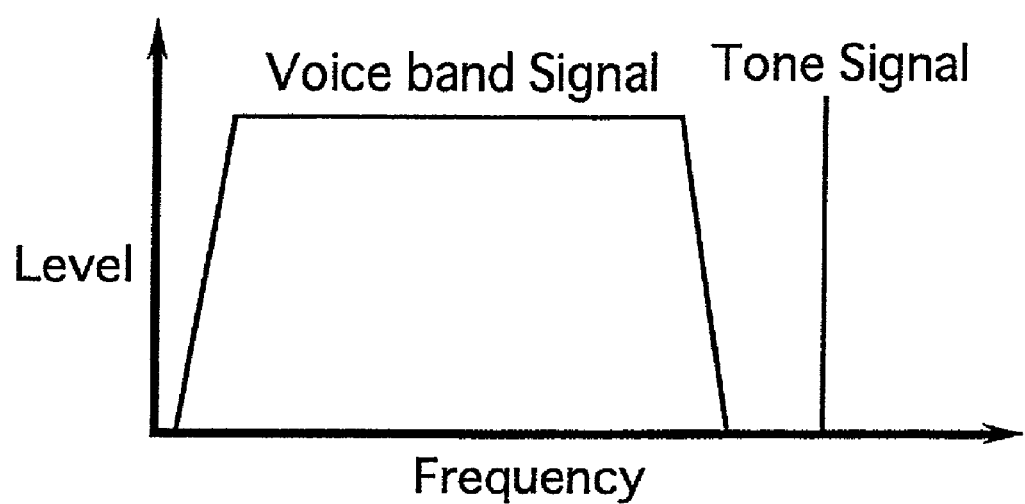
FIG. 23 is a graph used for describing a transmission signal including a voice signal and a tone signal.

The present embodiment of the wireless receiving apparatus 102 according to the present invention is adapted to output a voice signal. However, the wireless receiving apparatus 102 may be provided with a voice signal amplifying section 60, to enable to output the voice signal to a voice output device such as a speaker as shown in FIG. 20. In the aforesaid case, the control section 40 is adapted to control sound level of the voice amplifying section 60.

The present embodiment of the wireless communications system according to the present invention may comprise two wireless microphone transmission apparatuses 101a and 101b, and two wireless receiving apparatuses 102a and 102b, in which the wireless microphone transmission apparatuses 101a and 101b are adapted to transmit a radio microphone signal carrying a voice signal indicative of voice information and a tone signal indicative of data information to the wireless receiving apparatuses 102a and 102b, respectively as shown in FIG. 20. The wireless microphone transmission apparatuses 101a and 101b comprise respective control sections 40a and 40b, respective control signal outputting sections 41a and 41b, respective voice amplifying sections 60a and 60b, and respective receiving sections 61a and 61b. The control sections 40a and 40b are adapted to control the sound level of any one of the voice amplifying sections 60a and 60b. This means that the voice amplifying sections 60a and 60b are adapted to receive a control signal from any one of the control signal outputting sections 41 a and 41b. The voice amplifying section 60 (60a; 60b) constitutes the voice signal outputting means according to the present invention.

Receiving sections 61a and 61b each comprise a high-frequency amplifying section 30, a frequency conversion section 31, an intermediate-frequency amplifying section 32, a decoding section 33, a band pass filter 34, a squelch circuit section 35, a low-frequency amplifying section 36, a crystal filter 37, a squelch circuit control section 38, and a data information computing section 39, respectively.

In the wireless communications system according to the present invention, the same microphone frequency channel may be allocated to at least one microphone transmission apparatus and a plurality of specified wireless receiving apparatuses so that the wireless microphone transmission apparatus can transmit a radio microphone signal on the microphone frequency channel to the one or more specified wireless receiving apparatuses.

Alternately, in the wireless communications system according to the present invention, the same frequency channel may be allocated to a plurality of wireless microphone transmission apparatus and at least one wireless receiving apparatus. The wireless receiving apparatus in the wireless communications system can receive the radio microphone signal on the frequency channel carrying the voice signal indicative of the voice information and the tone signal indicative of the data information sequentially transmitted by one or more wireless microphone transmission apparatuses and the data information outputting unit can sequentially output the data information.

As will be seen from the foregoing description, the communications system according to the present invention comprises a transmission apparatus for transmitting a carrier communications signal carrying a voice signal indicative of voice information and a tone signal indicative of data information, and a receiving apparatus for receiving a carrier communications signal carrying a voice signal indicative of voice information and a tone signal indicative of data information between and a receiving apparatus.

What is claimed is:

1. A communications system for transmitting and receiving a carrier communication signal carrying a voice signal indicative of voice information and a tone signal indicative of data information, comprising:

transmission means for transmitting said carrier communication signal carrying said voice signal and said tone signal; and receiving means for receiving said carrier communication signal carrying said voice signal and said tone signal transmitted by said transmission means, said transmission means including:

a voice inputting unit for inputting said voice information therethrough to generate said voice signal indicative of said voice information;

a data inputting unit for inputting said data information therethrough;

a tone signal generating unit for generating said tone signal indicative of said data information on the basis of said data information inputted by said data inputting unit, said tone signal having a plurality of tones each having a signal level and repeated at predetermined time intervals;

a mixing unit for mixing said voice signal generated by said voice inputting unit and said tone signal generated by said tone signal generating unit to generate a communication signal carrying said voice signal and said tone signal;

a modulating unit for modulating said communication signal carrying said voice signal and said tone signal generated by said mixing unit with a carrier signal to generate a carrier communication signal carrying said voice signal and said tone signal;

a transmission unit for transmitting said carrier communication signal carrying said voice signal indicative of said voice information and said tone signal indicative of said data information modulated by said modulating unit, therethrough, and said receiving means including:

a receiving unit for receiving said carrier communication signal carrying said voice signal indicative of said voice information and said tone signal indicative of said data information transmitted by said transmission means;

a demodulating unit for demodulating said carrier communication signal carrying said voice information and said tone signal received by said receiving unit to generate said communication signal;

a voice signal filtering unit for filtering said voice signal indicative of said voice information therethrough from said communication signal generated by said demodulating unit;

a tone signal filtering unit for filtering said tone signal therethrough from said communication signal generated by said demodulating unit;

an integral computing unit for sequentially computing integrals of said signal levels of said tones of said tone signal passed through by said tone signal filtering unit, at first predetermined time intervals;
a data information computing unit for sequentially computing differences between two respective integrals of said signal levels of said tones of said tone signal computed by said integral computing unit, at respective second predetermined time intervals each starting at a leading point and ending at a trailing point to acquire said data information on the basis of said differences;
a data information outputting unit for outputting said data information acquired by said data information computing unit, therethrough; and
a voice information outputting unit for outputting said voice information on the basis of said voice signal filtered through by said voice signal filtering unit, therethrough, in accordance with said data information outputted by said data information outputting unit.

2. A communications system as set forth in claim 1, in which said data information computing unit of said receiving means is operative to judge whether said integrals of said signal levels of said tones of said tone signal computed by said integral computing unit are in a predetermined detectable range, and if said data information computing unit judges that said integrals of said signal levels of said tones of said tone signal are not in said predetermined detectable range, said data information computing unit is operative to instruct said integral computing unit of said receiving means to compensate said integrals thus computed so that said integrals thus compensated are in said predetermined detectable range, and said data information computing unit is operative to sequentially compute differences between two respective integrals of said signal levels of said tones of said tone signal compensated by said integral computing unit, at respective second predetermined time intervals each starting at a leading point and ending at a trailing point to acquire said data information on the basis of said differences.

3. A communication method for transmitting and receiving a carrier communication signal carrying a voice signal indicative of voice information and a tone signal indicative of data information, comprising the steps of:
(a) transmitting said carrier communication signal carrying said voice signal and said tone signal; and
(b) receiving said carrier communication signal carrying said voice signal and said tone signal transmitted in said step (a),
said step (a) including the steps of:
(a1) inputting said voice information therethrough to generate said voice signal indicative of said voice information;
(a2) inputting said data information therethrough;
(a3) generating said tone signal indicative of said data information on the basis of said data information inputted in said step (a2), said tone signal having a plurality of tones each having a signal level and repeated at predetermined time intervals;
(a4) mixing said voice signal generated in said step (a1) and said tone signal generated by said step (a3) to generate a communication signal carrying said voice signal and said tone signal;
(a5) modulating said communication signal carrying said voice signal and said tone signal generated in said step (a4) with a carrier signal to generate a carrier communication signal carrying said voice signal and said tone signal;
(a6) transmitting said carier communication signal carrying said voice signal indicative of said voice information and said tone signal indicative of said data information modulated in said step (a5), therethrough, and
said step (b) including the steps of:
(b1) receiving said carrier communication signal carrying said voice signal indicative of said voice information and said tone signal indicative of said data information transmitted in said step (a);
(b2) demodulating said carrier communication signal carrying said voice information and said tone signal received in said step (b1) to generate said communication signal;
(b3) filtering said voice signal indicative of said voice information therethrough from said communication signal generated in said step (b2);
(b4) filtering said tone signal therethrough from said communication signal generated in said step (b2);
(b5) sequentially computing integrals of said signal levels of said tones of said tone signal passed through in said step (b4), at first predetermined time intervals;
(b6) sequentially computing differences between two respective integrals of said signal levels of said tones of said tone signal computed in said step (b5), at respective second predetermined time intervals each starting at a leading point and ending at a trailing point to acquire said data information on the basis of said differences;
(b7) outputting said data information acquired by said step (b6), therethrough; and
(b8) outputting said voice information on the basis of said voice signal filtered through in said step (b3), therethrough, in accordance with said data information outputted in said step (b7).

4. A communication method as set forth in claim 3, in which said step (b6) has the step of (b61) judging whether said integrals of said signal levels of said tones of said tone signal computed by said (b5) are in a predetermined detectable range, and if it is judged that said integrals of said signal levels of said tones of said tone signal are not in said predetermined detectable range in the step (b61), said step (b5) has the step of (b51) compensating said integrals thus computed so that said integrals thus compensated are in said predetermined detectable range, and said step (b6) has the step of (b62) sequentially compute differences between two respective integrals of said signal levels of said tones of said tone signal compensated by said (b51), at respective second predetermined time intervals each starting at a leading point and ending at a trailing point to acquire said data information on the basis of said differences.

5. A wireless communications system for transmitting and receiving a radio microphone signal carrying a voice signal indicative of voice information and a tone signal indicative of data information, comprising:
at least one wireless microphone transmission apparatus for transmitting said radio microphone signal on a predetermined wireless microphone frequency channel carrying said voice signal and said tone signal; and
one wireless receiving apparatus for receiving said radio microphone signal on said predetermined wireless microphone frequency channel carrying said voice signal and said tone signal transmitted by said wireless microphone transmission apparatus, said wireless microphone frequency channel allocated to each of said wireless microphone transmission apparatuses and said wireless receiving apparatus;

said wireless microphone transmission apparatus including:
a voice inputting unit for inputting said voice information therethrough to generate said voice signal indicative of said voice information;
a data inputting unit for inputting said data information therethrough;
a tone signal generating unit for generating said tone signal indicative of said data information on the basis of said data information inputted by said data inputting unit, said tone signal having a plurality of tones each having a signal level and repeated at predetermined time intervals;
a mixing unit for mixing said voice signal generated by said voice inputting unit and said tone signal generated by said tone signal generating unit to generate a microphone signal carrying said voice signal and said tone signal;
a modulating unit for modulating said microphone signal on said predetermined wireless microphone frequency channel carrying said voice signal and said tone signal generated by said mixing unit with a carrier signal to generate said radio microphone signal on said predetermined wireless microphone frequency channel carrying said voice signal and said tone signal;
a transmission unit for transmitting said radio microphone signal on said predetermined wireless microphone frequency channel carrying said voice signal indicative of said voice information and said tone signal indicative of said data information modulated by said modulating unit, therethrough, and
said wireless receiving apparatus including:
a receiving unit for receiving said radio microphone signal on said predetermined wireless microphone frequency channel carrying said voice signal indicative of said voice information and said tone signal indicative of said data information transmitted by said wireless microphone transmission apparatus;
a demodulating unit for demodulating said radio microphone signal on said predetermined wireless microphone frequency channel carrying said voice information and said tone signal received by said receiving unit to generate said microphone signal;
a voice signal filtering unit for filtering said voice signal indicative of said voice information therethrough from said microphone signal generated by said demodulating unit;
a tone signal filtering unit for filtering said tone signal therethrough from said microphone signal generated by said demodulating unit;
an integral computing unit for sequentially computing integrals of said signal levels of said tones of said tone signal passed through by said tone signal filtering unit, at first predetermined time intervals;
a data information computing unit for sequentially computing differences between two respective integrals of said signal levels of said tones of said tone signal computed by said integral computing unit, at respective second predetermined time intervals each starting at a leading point and ending at a trailing point to acquire said data information on the basis of said differences;
a data information outputting unit for outputting said data information acquired by said data information computing unit, therethrough; and
a voice information outputting unit for outputting said voice information on the basis of said voice signal filtered through by said voice signal filtering unit, therethrough, in accordance with said data information outputted by said data information outputting unit.

6. A wireless communications system for transmitting and receiving a radio microphone signal carrying a voice signal indicative of voice information and a tone signal indicative of data information, comprising:
at least one wireless microphone transmission apparatus for transmitting said radio microphone signal on a predetermined wireless microphone frequency channel carrying said voice signal and said tone signal; and
a plurality of wireless receiving apparatuses for receiving said radio microphone signal on said predetermined wireless microphone frequency channel carrying said voice signal and said tone signal transmitted by said wireless microphone transmission apparatus, said wireless microphone frequency channel allocated to each of said wireless microphone transmission apparatuses and said wireless receiving apparatuses,
said wireless microphone transmission apparatus operative to transmit said radio microphone signal on said predetermined wireless microphone frequency channel to one or more specified wireless receiving apparatuses including:
a voice inputting unit for inputting said voice information therethrough to generate said voice signal indicative of said voice information;
a data inputting unit for inputting said data information therethrough;
a tone signal generating unit for generating said tone signal indicative of said data information on the basis of said data information inputted by said data inputting unit, said tone signal having a plurality of tones each having a signal level and repeated at predetermined time intervals;
a mixing unit for mixing said voice signal generated by said voice inputting unit and said tone signal generated by said tone signal generating unit to generate a microphone signal carrying said voice signal and said tone signal;
a modulating unit for modulating said microphone signal carrying said voice signal and said tone signal generated by said mixing unit with a carrier signal to generate said radio microphone signal on said predetermined wireless microphone frequency channel carrying said voice signal and said tone signal;
a transmission unit for transmitting said radio microphone signal on said predetermined wireless microphone frequency channel carrying said voice signal indicative of said voice information and said tone signal indicative of said data information modulated by said modulating unit, therethrough, and
said wireless receiving apparatus including:
a receiving unit for receiving said radio microphone signal on said predetermined wireless microphone frequency channel carrying said voice signal indicative of said voice information and said tone signal indicative of said data information transmitted by said wireless microphone transmission apparatus;
a demodulating unit for demodulating said radio microphone signal on said predetermined wireless microphone frequency channel carrying said voice information and said tone signal received by said receiving unit to generate said microphone signal;
a voice signal filtering unit for filtering said voice signal indicative of said voice information therethrough from said microphone signal generated by said demodulating unit;

a tone signal filtering unit for filtering said tone signal therethrough from said microphone signal generated by said demodulating unit;

an integral computing unit for sequentially computing integrals of said signal levels of said tones of said tone signal passed through by said tone signal filtering unit, at first predetermined time intervals;

a data information computing unit for sequentially computing differences between two respective integrals of said signal levels of said tones of said tone signal computed by said integral computing unit, at respective second predetermined time intervals each starting at a leading point and ending at a trailing point to acquire said data information on the basis of said differences;

a data information outputting unit for outputting said data information acquired by said data information computing unit, therethrough; and a voice information outputting unit for outputting said voice information on the basis of said voice signal filtered through by said voice signal filtering unit, therethrough, in accordance with said data information outputted by said data information outputting unit.

7. A wireless communications system as set forth in claim 5 or claim 6, in which said data information computing unit of said wireless receiving apparatus is operative to judge whether said integrals of said signal levels of said tones of said tone signal computed by said integral computing unit are in a predetermined detectable range, and if said data information computing unit judges that said integrals of said signal levels of said tones of said tone signal are not in said predetermined detectable range, said data information computing unit is operative to instruct said integral computing unit of said wireless receiving apparatus to compensate said integrals thus computed so that said integrals thus compensated are in said predetermined detectable range, and said data information computing unit is operative to sequentially compute differences between two respective integrals of said signal levels of said tones of said tone signal compensated by said integral computing unit, at respective second predetermined time intervals each starting at a leading point and ending at a trailing point to acquire said data information on the basis of said differences.

8. A wireless communications system as set forth in claim 5 or claim 6, in which said data information includes sound level control data information, said data inputting unit of said wireless microphone transmission apparatus is equipped with a sound level control unit for inputting said sound level control data information therethrough, said data tone signal generating unit of said wireless microphone transmission apparatus is operative to generate a tone signal indicative of said data information including said sound level control data information, said wireless receiving apparatus is operative to receive said radio microphone signal on said predetermined wireless microphone frequency channel carrying said voice signal indicative of said voice information and said tone signal indicative of said data information including said sound level control data information transmitted by said wireless microphone transmission apparatus, and said data information outputting unit of said wireless receiving apparatus is operative to output said data information including said sound level control data information.

9. A wireless communications system as set forth in claim 5 or claim 6, in which said data information includes a plurality of control data information elements, said data inputting unit of said wireless microphone transmission apparatus is equipped with a plurality of operation switches each for inputting said control data information element therethrough in accordance with an operation mode, and a mode selection switch for inputting mode information therethrough to select said operation mode from among a plurality of operation modes on the basis of said mode information, said data tone signal generating unit of said wireless microphone transmission apparatus is operative to generate a tone signal indicative of said data information including said control data information elements inputted by said operation switch, said wireless receiving apparatus is operative to receive said radio microphone signal on said predetermined wireless microphone frequency channel carrying said voice signal indicative of said voice information and said tone signal indicative of said data information including said control data information element transmitted by said wireless microphone transmission apparatus, and said data information outputting unit of said wireless receiving apparatus is operative to output said data information including said control data information element.

10. A wireless communications system as set forth in claim 5 or claim 6, in which said wireless receiving apparatus is operative to receive said radio microphone signal on said predetermined wireless microphone frequency channel carrying said voice signal indicative of said voice information and said tone signal indicative of said data information including said sound level control data information sequentially transmitted by one or more wireless microphone transmission apparatuses, and said data information outputting unit of said wireless receiving apparatus is operative to sequentially output said data information including said sound level control data information.

11. A wireless communications system as set forth in claim 5 or claim 6, further comprising an audio system electrically connected with said wireless receiving apparatus, in which said data information includes audio system control data, said data information outputting unit of said wireless receiving apparatus is operative to output said audio system control data to said audio system, said voice information outputting unit of said wireless receiving apparatus is operative to output said voice information to said audio system, and said audio system is operative to operate in accordance with said audio system control data.

12. A wireless communications system as set forth in claim 5 or claim 6, further comprising an audio-visual system electrically connected with said wireless receiving apparatus, in which said data information includes audio-visual system control data, said data information outputting unit of said wireless receiving apparatus is operative to output said audio-visual system control data to said audio-visual system, said voice information outputting unit of said wireless receiving apparatus is operative to output said voice information to said audio-visual system, and said audio-visual system is operative to operate in accordance with said audio-visual system control data.

13. A wireless communications system as set forth in claim 5 or claim 6, in which said data information outputting unit of said wireless receiving apparatus is capable of being electrically connected with an external device and outputting said data information to said external device.

14. A wireless communications system as set forth in claim 5 or claim 6, in which said voice information outputting unit of said wireless receiving apparatus is capable of being electrically connected with an external device and outputting said voice information to said external device.

15. A wireless microphone transmission apparatus for transmitting a radio microphone signal on a predetermined wireless microphone frequency channel carrying a voice signal indicative of voice information and a tone signal indicative of data information, comprising:
- a voice inputting unit for inputting said voice information therethrough to generate said voice signal indicative of said voice information;
- a data inputting unit for inputting said data information therethrough;
- a tone signal generating unit for generating said tone signal indicative of said data information on the basis of said data information inputted by said data inputting unit, said tone signal having a plurality of tones each having a signal level and repeated at predetermined time intervals;
- a mixing unit for mixing said voice signal generated by said voice inputting unit and said tone signal generated by said tone signal generating unit to generate a microphone signal carrying said voice signal and said tone signal;
- a modulating unit for modulating said microphone signal carrying said voice signal and said tone signal generated by said mixing unit with a carrier signal to generate said radio microphone signal on said predetermined wireless microphone frequency channel carrying said voice signal and said tone signal; and
- a transmission unit for transmitting said radio microphone signal on said predetermined wireless microphone frequency channel carrying said voice signal indicative of said voice information and said tone signal indicative of said data information modulated by said modulating unit, therethrough.

16. A wireless microphone transmission apparatus as set forth in claim 15, in which said wireless microphone transmission apparatus is operative to transmit said radio microphone signal on said predetermined wireless microphone frequency channel to one or more specified wireless receiving apparatuses.

17. A wireless microphone transmission apparatus as set forth in claim 15, in which said data information includes sound level control data information, said data inputting unit is equipped with a sound level control unit for inputting said sound level control data information therethrough, said data tone signal generating unit is operative to generate a tone signal indicative of said data information including said sound level control data information.

18. A wireless microphone transmission apparatus as set forth in claim 15, in which said data information includes a plurality of control data information elements, said data inputting unit is equipped with a plurality of operation switches each for inputting said control data information element therethrough in accordance with an operation mode, and a mode selection switch for inputting mode information therethrough to select said operation mode from among a plurality of operation modes on the basis of said mode information, said data tone signal generating unit is operative to generate a tone signal indicative of said data information including said control data information elements inputted by said operation switch.

19. A wireless receiving apparatus for receiving a radio microphone signal on a predetermined wireless microphone frequency channel carrying a voice signal indicative of voice information and a tone signal indicative of data information, comprising:
- a receiving unit for receiving said radio microphone signal on said predetermined wireless microphone frequency channel carrying said voice signal indicative of said voice information and said tone signal indicative of said data information;
- a demodulating unit for demodulating said radio microphone signal on said predetermined wireless microphone frequency channel carrying said voice information and said tone signal received by said receiving unit to generate said microphone signal;
- a voice signal filtering unit for filtering said voice signal indicative of said voice information therethrough from said microphone signal generated by said demodulating unit;
- a tone signal filtering unit for filtering said tone signal therethrough from said microphone signal generated by said demodulating unit;
- an integral computing unit for sequentially computing integrals of said signal levels of said tones of said tone signal passed through by said tone signal filtering unit, at first predetermined time intervals;
- a data information computing unit for sequentially computing differences between two respective integrals of said signal levels of said tones of said tone signal computed by said integral computing unit, at respective second predetermined time intervals each starting at a leading point and ending at a trailing point to acquire said data information on the basis of said differences;
- a data information outputting unit for outputting said data information acquired by said data information computing unit, therethrough; and
- a voice information outputting unit for outputting said voice information on the basis of said voice signal filtered through by said voice signal filtering unit, therethrough, in accordance with said data information outputted by said data information outputting unit.

20. A wireless receiving apparatus as set forth in claim 19, in which said data information computing unit is operative to judge whether said integrals of said signal levels of said tones of said tone signal computed by said integral computing unit are in a predetermined detectable range, and if said data information computing unit judges that said integrals of said signal levels of said tones of said tone signal are not in said predetermined detectable range, said data information computing unit is operative to instruct said integral computing unit to compensate said integrals thus computed so that said integrals thus compensated are in said predetermined detectable range, and said data information computing unit is operative to sequentially compute differences between two respective integrals of said signal levels of said tones of said tone signal compensated by said integral computing unit, at respective second predetermined time intervals each starting at a leading point and ending at a trailing point to acquire said data information on the basis of said differences.

21. A wireless receiving apparatus as set forth in claim 19, in which said receiving unit is operative to receive said radio microphone signal on said predetermined wireless microphone frequency channel carrying said voice signal indicative of said voice information and said tone signal indicative of said data information sequentially transmitted by one or more wireless microphone transmission apparatuses, and said data information outputting unit is operative to sequentially output said data information.

22. A wireless receiving apparatus as set forth in claim 19, further comprising a terminal to be electrically connectable with an audio system, said data information including audio system control data, said data information outputting unit operative to output said audio system control data to said audio system, and said voice information outputting unit operative to output said voice information to said audio system.

23. A wireless receiving apparatus as set forth in claim 19, further comprising a terminal to be electrically connectable with an audio-visual system, said data information including audio-visual system control data, said data information outputting unit operative to output said audio-visual system control data to said audio-visual system, and said voice information outputting unit operative to output said voice information to said audio-visual system.

24. A wireless receiving apparatus as set forth in claim 19, in which said data information outputting unit is capable of being electrically connected with an external device and outputting said data information to said external device.

25. A wireless receiving apparatus as set forth in claim 19, in which said voice information outputting unit is capable of being electrically connected with an external device and outputting said voice information to said external device.

* * * * *